(12) United States Patent
Biris et al.

(10) Patent No.: US 8,153,942 B2
(45) Date of Patent: *Apr. 10, 2012

(54) METHODS OF MAKING HORIZONTALLY ORIENTED LONG CARBON NANOTUBES AND APPLICATIONS OF SAME

(75) Inventors: Alexandru S. Biris, Little Rock, AR (US); Enkeleda Dervishi, Little Rock, AR (US); Yang Xu, Little Rock, AR (US); Zhongrui Li, Little Rock, AR (US)

(73) Assignee: Board of Trustees of the University of Arkansas, Little Rock, AR (US)

( * ) Notice: Subject to any disclaimer, the term of this patent is extended or adjusted under 35 U.S.C. 154(b) by 610 days.

This patent is subject to a terminal disclaimer.

(21) Appl. No.: 12/371,851

(22) Filed: Feb. 16, 2009

(65) Prior Publication Data

US 2009/0257945 A1 Oct. 15, 2009

Related U.S. Application Data

(60) Continuation of application No. 12/217,978, filed on Jul. 10, 2008, now Pat. No. 8,017,892, which is a division of application No. 11/228,023, filed on Sep. 15, 2005, now Pat. No. 7,473,873, which is a continuation-in-part of application No. 11/131,912, filed on May 18, 2005.

(60) Provisional application No. 60/571,999, filed on May 18, 2004, provisional application No. 60/611,018, filed on Sep. 17, 2004.

(51) Int. Cl.
*H05B 6/10* (2006.01)

(52) U.S. Cl. .................................. 219/634; 977/700
(58) Field of Classification Search .......... 219/600–677; 977/700, 701–838
See application file for complete search history.

(56) References Cited

U.S. PATENT DOCUMENTS 2,826,666 A   3/1958   Cater
(Continued)

FOREIGN PATENT DOCUMENTS

WO            02060813 A2   8/2002

OTHER PUBLICATIONS

Iijima, S., "Helical Microtubules of Graphitic Carbon," Nature, vol. 353, pp. 56-58 (1991).

(Continued)

*Primary Examiner* — Daniel L Robinson
(74) *Attorney, Agent, or Firm* — Morris Manning & Martin LLP; Tim Tingkang Xia, Esq.

(57) ABSTRACT

An apparatus and method for synthesizing nanostructures in a reactor having a reaction zone and a conductive susceptor positioned in the reaction zone. In one embodiment, the method has the steps of placing a semiconductor plate having a film of a catalyst in the reaction zone such that the semiconductor plate is supported by the conductive susceptor; transporting a gas mixture having a feedstock gas having hydrocarbon and a carrier gas into the reaction zone of the chamber; inductively heating the reaction zone; and regulating the heating so that the temperature of the conductive susceptor increases from a first temperature to a second temperature when the gas mixture is introduced into the cavity of the chamber to allow nanostructures to be grown from the interaction of the gas mixture with the film of a catalyst of the semiconductor plate.

26 Claims, 18 Drawing Sheets

HEATING A REACTION ZONE
1005

→

INTRODUCING CONSECUTIVELY BATCHES OF A CATALYST INTO THE REACTION ZONE FROM THE FIRST ENTRY WAY AND THE SECOND ENTRY WAY, RESPECTIVELY
910

U.S. PATENT DOCUMENTS

| | | | |
|---|---|---|---|
| 3,845,738 | A | 11/1974 | Berkman et al. |
| 4,000,716 | A | 1/1977 | Kurata et al. |
| 4,147,571 | A | 4/1979 | Stringfellow et al. |
| 4,794,217 | A | 12/1988 | Quan et al. |
| 4,900,525 | A | 2/1990 | D'Angelo et al. |
| 5,439,844 | A | 8/1995 | Sakai |
| 5,695,567 | A | 12/1997 | Kordina et al. |
| 5,895,526 | A | 4/1999 | Kitoh et al. |
| 6,299,683 | B1 | 10/2001 | Rupp et al. |
| 6,336,971 | B1 | 1/2002 | Nagato et al. |
| 6,583,085 | B1 | 6/2003 | Nakayama et al. |
| 6,605,266 | B2 | 8/2003 | Nesper et al. |
| 6,690,710 | B2 | 2/2004 | Fishman et al. |
| 6,692,717 | B1 | 2/2004 | Smalley et al. |
| 6,709,520 | B1 | 3/2004 | Leycuras |
| 6,713,519 | B2 | 3/2004 | Wang et al. |
| 6,759,025 | B2 | 7/2004 | Hong et al. |
| 6,761,870 | B1 | 7/2004 | Smalley et al. |
| 6,780,766 | B2 | 8/2004 | Basceri et al. |
| 6,793,967 | B1 | 9/2004 | Ata et al. |
| 8,017,892 | B2 * | 9/2011 | Biris et al. ............... 219/643 |
| 2002/0079690 | A1 * | 6/2002 | Forbes ............... 283/36 |
| 2002/0102353 | A1 | 8/2002 | Mauthner et al. |
| 2002/0127170 | A1 | 9/2002 | Hong et al. |
| 2003/0079689 | A1 | 5/2003 | Sumakeris et al. |
| 2003/0109382 | A1 * | 6/2003 | Nakayama et al. ........... 502/336 |
| 2003/0115986 | A1 | 6/2003 | Pozarnsky et al. |
| 2003/0133866 | A1 | 7/2003 | Jurng et al. |
| 2003/0148086 | A1 | 8/2003 | Pfefferle et al. |
| 2004/0052289 | A1 | 3/2004 | Chang et al. |
| 2004/0100902 | A1 | 5/2004 | Vimalchand et al. |
| 2004/0245591 | A1 | 12/2004 | Wang et al. |
| 2005/0000437 | A1 | 1/2005 | Tombler, Jr. et al. |
| 2005/0112052 | A1 | 5/2005 | Gu et al. |
| 2007/0037370 | A1 | 2/2007 | Suekane et al. |
| 2007/0098622 | A1 | 5/2007 | Nakayama et al. |
| 2008/0159943 | A1 | 7/2008 | Gu et al. |
| 2008/0223851 | A1 | 9/2008 | Biris et al. |

OTHER PUBLICATIONS

Ando, Y. et al., "Growing Carbon Nanotubes," Materials Today, pp. 22-29 (2004).

Soneda, Y. et al., "Synthesis of High Quality Multi-Walled Carbon Nanotubes From the Decomposition of Acetylene on Iron-Group Metal Catalysts Supported on MgO," Carbon, vol. 40, pp. 965-969 (2002).

Couteau, E. et al., "CVD Synthesis of High-Purity Multiwalled Carbon Nanotubes Using CaCO3 Catalyst Support for Large-Scale Production," Chem. Phys. Letters., vol. 378, pp. 9-17 (2003).

Xu, J.M. et al., "Preparation of Mg1-xFexMoO4 Catalyst and It's Application to Grow MWNTs with High Efficiency," Diamond & Related Materials, vol. 13, pp. 1807-1811 (2004).

Li, Y. et al., "Mass Production of High-Quality Multi-Walled Carbon Nanotubes Bundles on a Ni/Mo/MgO Catalyst," Carbon, vol. 43, pp. 295-301 (2005).

Hata, K. et al., "Water-Assisted Highly Efficient Synthesis of Impurity-Free Single-Walled Carbon Nanotubes" Science, vol. 306, pp. 1362-1364 (2004).

Rebouillant, S. et al., "Carbon Fibers," Third Edition, Revised and Expanded (1998).

Gennett, T et al., "Laser Synthesis of Single-Walled Carbon Nanotube Utilizing High Temperature Induction Heating," Mat Res Soc Symp Proc, vol. 633, pp. A2.3.1-A2.3.6 (2001).

Schmitt, T.C., et al., "Analysis of effluent gases during the CCVD growth of multi-wall carbon nanotubes from acetylene," Carbon, 44 (10), p. 2032-2038 (2006).

Lupu, D. et al., "Carbon Nanostructures Produced by CCVD with Induction Heating," Carbon, vol. 42, pp. 503-507 (2004).

Okamoto, A. et al., "Control of Diameter Distribution of Single-Walled Carbon Nanotubes Using the Zeolite-CCVD Method at Atmospheric Pressure," Carbon, vol. 43, pp. 431-436 (2005).

Aldea, N. et al. "A New X-Ray Line Profile Approximation Used for the Evaluation of the Global Nanostructure of Nickel Clusters," J. Opt. Adv. Mat., vol. 6, pp. 225-235 (2004).

Ruckenstein, E. et al., "Metal-Support Interactions in Catalysis, Sintering, and Redispersion," Edited by Scott A. Stevenson et al. (1987).

Zaikovskii, V. et al., "The Relationship Between the State of Active Species in a Ni/Al2O3 Catalyst and the Mechanism of Growth of Filamentous Carbon," Kinetics Catal, vol. 42, No. 6, pp. 813-820 (2001).

Liang, Q. et al., "Carbon Nanotube Growth on Ni-Particles Prepared in situ by Reduction of LaNiO4," Carbon, vol. 39, pp. 897-903 (2001).

Sato, S. et al., "Growth of Diameter-Controlled Carbon Nanotubes Using Monodispersed Nickel Nanoparticles Obtained with a Differential Mobility Analyzer," Chem. Phys. Letters, vol. 382, pp. 361-366 (2003).

Little, R.B., "Mechanistic Aspects of Carbon Nanotube Nucleation and Growth," J. Cluster Science, vol. 14, pp. 135-185 (2003).

Piao, L. et al., "Methane Decomposition to Carbon Nanotubes and Hydrogen on Alumina Supported Nickel Aerogel Catalyst," Catalysis Today, vol. 74, pp. 145-155, 2002.

Topasztó, L. et al., "Diameter and Morphology Dependence on Experimental Conditions of Carbon Nanotube Arrays Grown by Spray Pyrolysis," Carbon, vol. 43, pp. 970-977 (2005).

Magrez, A. et al., "Growth of Carbon Nanotubes With Alkaline Earth Carbonate as Support," J. Phys. Chem. vol. 109, pp. 10087-10091 (2005).

* cited by examiner

METHODS OF MAKING HORIZONTALLY ORIENTED LONG CARBON NANOTUBES AND APPLICATIONS OF SAME

CROSS-REFERENCE TO RELATED PATENT APPLICATION

This application claims the benefit of U.S. patent application Ser. No. 12/217,978, filed Jul. 10, 2008, entitled "Apparatus and Methods for Synthesis of Large Size Batches of Carbon Nanostructures," by Biris et al., disclosure of which is hereby incorporated herein in its entirety by reference, and which is a divisional application of, and claims benefit of U.S. patent application Ser. No. 11/228,023, filed Sep. 15, 2005, entitled "Apparatus and Methods for Synthesis of Large Size Batches of Carbon Nanostructures," by Biris et al., disclosure of which is hereby incorporated herein in its entirety by reference, and which status is issued as U.S. Pat. No. 7,473,873 and is a continuation-in-part of U.S. patent application Ser. No. 11/131,912, filed May 18, 2005, entitled "APPARATUS AND METHODS OF MAKING NANOSTRUCTURES BY INDUCTIVE HEATING," by Alexandru Radu Biris, Dan Lupu, Alexandru Sorin Biris, Jon Gardner Wilkes, Dan Alexander Buzatu, Dwight Wayne Miller, and Jerry A. Darsey, the disclosure of which is hereby incorporated herein by reference in its entirety, which status is pending and itself claims the benefit, pursuant to 35 U.S.C. §119(e), of U.S. provisional patent application Ser. No. 60/571,999, filed May 18, 2004, entitled "APPARATUS AND METHODS OF HIGH THROUGHPUT GENERATION OF NANOSTRUCTURES BY INDUCTIVE HEATING AND IMPROVEMENTS INCREASING PRODUCTIVITY WHILE MAINTAINING QUALITY AND PURITY," by Alexandru Radu Biris, Dan Lupu, Alexandru Sorin Biris, Jon Gardner Wilkes, Dan Alexander Buzatu, Dwight Wayne Miller, and Jerry A. Darsey, which is incorporated herein by reference in its entirety, and which also claims the benefit, pursuant to 35 U.S.C. §119(e), of U.S. provisional patent application Ser. No. 60/611,018, filed Sep. 17, 2004, entitled "APPARATUS AND METHODS FOR SYNTHESIS OF LARGE SIZE BATCHES OF CARBON NANOSTRUCTURES," by Alexandru Sorin Biris, Dan Alexander Buzatu, Alexandru Radu Biris, Jon Gardner Wilkes, Dwight Wayne Miller, Jerry A. Darsey, and Dan Lupu, which is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

FIELD OF THE INVENTION

The present invention is generally related to the field of production of nanostructures, and, more particularly, is related to apparatus and methods for synthesizing nanostructures including carbon nanotubes.

BACKGROUND OF THE INVENTION

One of the most promising technologies for commercially producing carbon nanostructures such as single wall nanotubes, multi-wall nanotubes, nanofibers, and fullerenes is catalytic chemical vapor deposition (hereinafter "CCVD"). As illustrated in FIG. 1, in a CCVD type reactor, a hydrocarbon gas, or a hydrocarbon/carrier gas combination 10 is introduced into a reaction chamber 20 and passed over a susceptor 30 that contains a metal catalyst 40 heated to a specific temperature. The carrier gas can be nitrogen, argon, hydrogen, or helium. The reaction chamber 20 and the susceptor 30 are normally made from graphite, ceramic, or metal. The heating is achieved by using heating coils 70 wrapping around the reaction chamber 20. The metal catalyst 40 such as Fe, Co, or Ni, causes the hydrocarbon gas to decompose into its component carbon atoms, after which the carbon atoms recombine on the catalytic surface to form carbon nanostructures of various diameters and lengths. However, there are limitations with CCVD type reactor that limit the amount of nanostructures that can be produced at one time.

One of the major limitations of a conventional CCVD type reactor for nanostructure synthesis is the size of a susceptor that can be used. Large size susceptors, desirable for producing large quantities of carbon nanostructures, introduce difficulties in controlling the hydrocarbon gas flow over the catalyst powder bed and attaining tight control of a reaction temperature. It is known that when a hydrocarbon or a mixture of hydrocarbon and carrier gas, also called carbon feedstock or feedstock gas, moves horizontally along the susceptor 30, the catalyst 50 placed at the front end of the susceptor 30 is exposed to the carbon feedstock before the catalyst 60 at the end of the susceptor 30, usually depleting the carbon feedstock gas before it reaches the end of the susceptor 30. The catalyst 60 at the end of the susceptor 30 usually comes into contact with the feedstock gas when the nanostructures growing on the catalyst 50 at the front end of the susceptor 30 can no longer expand. Nanostructures grown in such reactors have large variations in lengths and diameters. Furthermore, the use of conventional ovens results in temperature gradient along the length of the oven. This temperature gradient results in varying temperature conditions that have a significant negative impact on the quality, characteristics, and purity of carbon nanostructures grown therein. Additionally, conventional ovens consume large amounts of energy and heat inefficiently. Because uniform length, diameter, and high purity are desired properties for carbon nanostructure, the performance of CCVD type reactor needs to be improved.

Moreover, long and aligned carbon nanotubes (CNTs) are excellent candidates for many applications such as nano-electronic devices, field emitter transistors (FETs), nano-composite materials with new and improved properties, Silicon based devices and many other similar applications but they are difficult to grow.

Many researchers have tried to grow long CNTs using different methods such as laser ablation, arc discharge and CCVD. Out of all the methods, CCVD has proven to be the most successful for grow of long nanotubes in large scale. In the CCVD method, by controlling the growth conditions one can control the length and morphology of CNTs. Factors such as the nanoparticle catalytic lifetime, the interaction between the nanoparticle and the support, and synthesis conditions strongly influence the length and orientation of long CNTs.

In the past, people tried to grow horizontally aligned CNTs using different catalytic systems utilizing the conventional chemical vapor deposition. Different techniques such as spin coating, electroless plating, sputtering, micro-contact printing, electrospray, and many more have been previously used for catalyst deposition on flat surfaces.

Once long CNTs are grown they can be aligned using different methods such as wet chemical assemblies, high temperature extrusion techniques, electric fields, or using different solution depositions and dielectrophoresis. Usually, these methods are pretty tedious and not very successful. In addition to Fe, other metals such as Co, Mo, Ni and many more or a mixture of two different metals can be utilized as catalytic systems. Straight CNTs were grown on Co—Ni catalyst system but they were not aligned.

Therefore, a heretofore unaddressed need exists in the art to address the aforementioned deficiencies and inadequacies.

SUMMARY OF THE INVENTION

In one aspect, the present invention relates to an apparatus for synthesizing nanostructures. In one embodiment, the apparatus includes a chamber that has a first end, an opposite, second end, and a body portion defined therebetween and defining a cavity with an axis. The chamber further has a first opening channel interconnecting through the first end in fluid communication with the cavity, and a second opening channel interconnecting through the second end in fluid communication with the cavity. In one embodiment, the first opening channel is adapted for inputting a gas mixture, and the second opening channel is adapted for outputting an exhaust gas mixture, respectively. In one embodiment, the gas mixture flows from the first opening channel to the second opening channel of the chamber. The gas mixture includes at least one of a carrier gas and a feedstock gas. In one embodiment, the feedstock gas has hydrocarbon. The exhaust gas mixture has at least one of a carrier gas and an un-reacted feedstock gas. The chamber is made from graphite, quartz, metal, or a combination thereof.

The apparatus further has a heating member formed on the exterior surface of the chamber for heating the chamber so as to create a reaction zone in the cavity, wherein the heating member comprises a thermal oven, an inductive oven, or a combination thereof. A susceptor, which has a body portion defining a recess with a bottom surface therein, is placed in the reaction zone, wherein the susceptor is made from graphite, ceramic, metal, or a combination thereof.

A semiconductor plate, which has a film of a catalyst at least partially covering a first surface of the semiconductor plate, is placed in the recess and supported by the bottom surface of the susceptor such that a second surface of the semiconductor plate, which is opposite to the first surface of the semiconductor plate, is in contact with the bottom surface of the susceptor. The semiconductor plate having a film of a catalyst and the susceptor are adapted such that when a gas having hydrocarbon passes through the cavity of the chamber, the interaction of the gas having hydrocarbon with the film of a catalyst produces carbon nanostructures.

In one embodiment, the semiconductor plate is made of Si.

In one embodiment, the catalyst comprises a Fe catalyst, a conditioning catalyst, or a combination thereof.

In one embodiment, the gas having hydrocarbon comprises acetylene, methane, or a combination thereof.

In one embodiment, the carbon nanostructures comprise nanotubes.

In another aspect, the present invention relates to a method for synthesizing nanostructures. In one embodiment, the method has the step of providing an apparatus, wherein the apparatus has a chamber having a first end, an opposite, second end, and a body portion defined therebetween and defining a cavity with an axis, a heating member formed on the exterior surface of the chamber for heating the chamber so as to create a reaction zone in the cavity; a susceptor having a body portion defining a recess with a bottom surface therein, and placed in the reaction zone, and a semiconductor plate having a film of a catalyst at least partially covering a first surface of the semiconductor plate, and placed in the recess and supported by the bottom surface of the susceptor such that a second surface of the semiconductor plate, which is opposite to the first surface of the semiconductor plate, is in contact with the bottom surface of the susceptor.

The method further includes the steps of introducing a gas mixture through the first opening channel into the cavity of the chamber; and generating nanostructures from the interaction of the gas mixture with the film of a catalyst in the reaction zone.

The gas mixture has at least one of a carrier gas and a feedstock gas, wherein the feedstock gas comprises hydrocarbon. In one embodiment, the feedstock gas having hydrocarbon has acetylene, methane, or a combination thereof.

The method further has the steps of turning on the heating member so that the temperature of the susceptor reaches a first temperature, increasing the temperature of the susceptor from the first temperature to a second temperature when the gas mixture is introduced into the cavity of the chamber, and keeping the temperature of the susceptor substantially at the second temperature when nanostructures are generated. In one embodiment, the first temperature is below about 700° C., and the first temperature is above about 700° C.

In yet another aspect, the present invention relates to an apparatus for synthesizing nanostructures. In one embodiment, the apparatus has a chamber having a first end, an opposite second end, and a body portion defined therebetween, a heating member formed on the exterior surface of the body portion of the chamber defining a reaction zone inside the chamber, a conductive susceptor positioned in the reaction zone, and a semiconductor plate having a film of a catalyst, and supported by the conductive susceptor, wherein the heating member comprises a conductive inductor in the form of inductor coils, and wherein the conductive inductor is configured such that, in operation, when a gas having hydrocarbon passes through the cavity of the chamber, the conductive inductor allows an alternating current to pass through to generate an electromagnetic field with a frequency at least in the reaction zone and induce current in the conductive susceptor so as to generate a heat flow from the conductive susceptor to the body portion of the chamber to allow nanostructures to be grown from the interaction of the gas having hydrocarbon with the film of a catalyst of the semiconductor plate.

The conductive susceptor is made of a substantially conductive material, wherein the conductive susceptor is made of a substantially conductive material that is chemically compatible to carbon and its compounds. In one embodiment, the substantially conductive material that is chemically compatible to carbon and its compounds comprises graphite.

In one embodiment, the semiconductor plate is made of Si.

In a further aspect, the present invention relates to a method for synthesizing nanostructures in a reactor having a reaction zone and a conductive susceptor positioned in the reaction zone. In one embodiment, the method has the steps of placing a semiconductor plate having a film of a catalyst in the reaction zone such that the semiconductor plate is supported by the conductive susceptor; transporting a gas mixture having a feedstock gas having hydrocarbon and a carrier gas into the reaction zone of the chamber; inductively heating the reaction zone; and regulating the heating so that the temperature of the conductive susceptor increases from a first temperature to a second temperature when the gas mixture is introduced into the cavity of the chamber to allow nanostructures to be grown from the interaction of the gas mixture with the film of a catalyst of the semiconductor plate.

In one embodiment, the inductively heating step includes the step of inducing current in the conductive susceptor so as to generate a heat flow from the conductive susceptor.

In one embodiment, the feedstock gas having hydrocarbon comprises acetylene, methane, or a combination thereof.

In one embodiment, the first temperature is below about 700° C., and the first temperature is above about 700° C.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
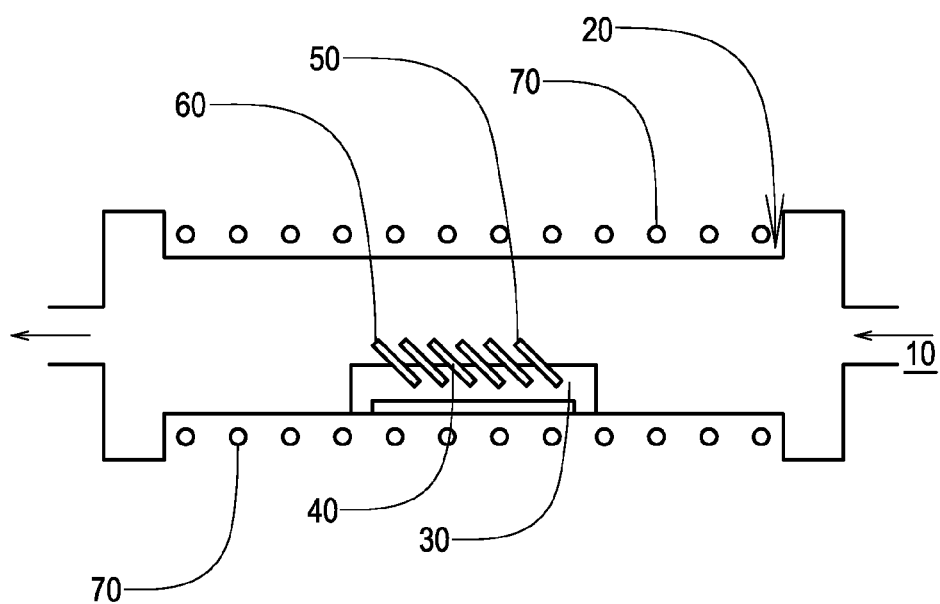
FIG. 1 shows schematically a catalytic chemical vapor deposition type reactor.

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which has no influence on the scope of the invention. Additionally, some terms used in this specification are more specifically defined below.

DEFINITIONS

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "nanoscopic-scale," "nanoscopic," "nanometer-scale," "nanoscale," the "nano-" prefix, and the like generally refers to elements or articles having widths or diameters of less than about 1 μm, preferably less than about 100 nm in some cases. In all embodiments, specified widths can be smallest width (i.e. a width as specified where, at that location, the article can have a larger width in a different dimension), or largest width (i.e. where, at that location, the article's width is no wider than as specified, but can have a length that is greater).

As used herein, "carbon nanostructures" refer to carbon fibers or carbon nanotubes that have a diameter of 1 μm or smaller which is finer than that of carbon fibers. However, there is no particularly definite boundary between carbon fibers and carbon nanotubes. By a narrow definition, the material whose carbon faces with hexagon meshes are almost parallel to the axis of the corresponding carbon tube is called a carbon nanotube, and even a variant of the carbon nanotube, around which amorphous carbon exists, is included in the carbon nanotube.

As used herein, "catalytic chemical vapor deposition method" or "CCVD" refers to a method in the art to synthesize fullerenes and carbon nanotubes by using acetylene gas, methane gas, or the like that contains carbon as a raw material, and generating carbon nanotubes in chemical decomposition reaction of the raw material gas. Among other things, the chemical vapor deposition depends on chemical reaction occurring in the thermal decomposition process of the methane gas and the like serving as the raw material, thereby enabling the manufacture of carbon nanotubes having high purity.

As used herein, "reaction zone" refers to a three-dimensional zone inside a nanostructure reactor where hydrocarbon molecules are heated to produce carbon molecules.

As used herein, "isothermal zone" refers to a reaction zone where the temperature is substantially the same.

As used herein, the term "atomic force microscope (AFM)" or scanning force microscope (SFM) refers to a very high-resolution type of scanning probe microscope, with demonstrated resolution of fractions of a nanometer, more than 1000 times better than the optical diffraction limit. The term "microscope" in the name of "AFM" is actually a misnomer because it implies looking, while in fact the information is gathered or the action is taken by "feeling" the surface with a mechanical probe. The AFM in general has a microscale cantilever with a tip portion (probe) at its end that is used to scan the specimen surface. The cantilever is typically silicon or silicon nitride with a tip radius of curvature on the order of nanometers. When the tip is brought into proximity of a sample surface, forces between the tip and the sample lead to a deflection of the cantilever according to Hooke's law. The AFM can be utilized in a variety of applications.

As used herein, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, the term "Raman spectroscopy" refers to an optical technique that probes the specific molecular content of a sample by collecting in-elastically scattered light. As photons propagate through a medium, they undergo both absorptive and scattering events. In absorption, the energy of the photons is completely transferred to the material, allowing either heat transfer (internal conversion) or re-emission phenomena such as fluorescence and phosphorescence to occur. Scattering, however, is normally an in-elastic process, in which the incident photons retain their energy. In Raman scattering, the photons either donate or acquire energy from the medium, on a molecular level. In contrast to fluorescence, where the energy transfers are on the order of the electronic bandgaps, the energy transfers associated with Raman scattering are on the order of the vibrational modes of the molecule. These vibrational modes are molecularly specific, giving every molecule a unique Raman spectral signature.

DESCRIPTION OF THE PREFERRED EMBODIMENTS

Nanostructure reactors that implement CCVD methods to produce carbon nanostructures require that hydrocarbon molecules be deposited on a heated catalyst material. Catalysts are typically used to disassociate the hydrocarbon molecules. Using hydrocarbons as a carbon source, the hydrocarbons flow into a reaction zone of a nanostructure reactor, where the hydrocarbons are heated at a high temperature. The dissociation of the hydrocarbon breaks the hydrogen bond, thus producing pure carbon molecules. The important parameters that influence the growth of carbon nanostructures are the nature and support of the catalyst, the hydrocarbon source and concentration, flow rate and type of carrier gas, time of reaction, temperature of reaction and the thermal stability in the reaction zone.

The present invention relates to apparatus and methods for synthesizing high quality and purity nanostructures such as long, aligned nanotubes by, among other things, distributing a feedstock gas over a catalyst in a number of ways and improving the interaction of the feedstock gas with the catalyst.

Without intent to limit the scope of the invention, various embodiments of the present invention are described below.

Figure 2:
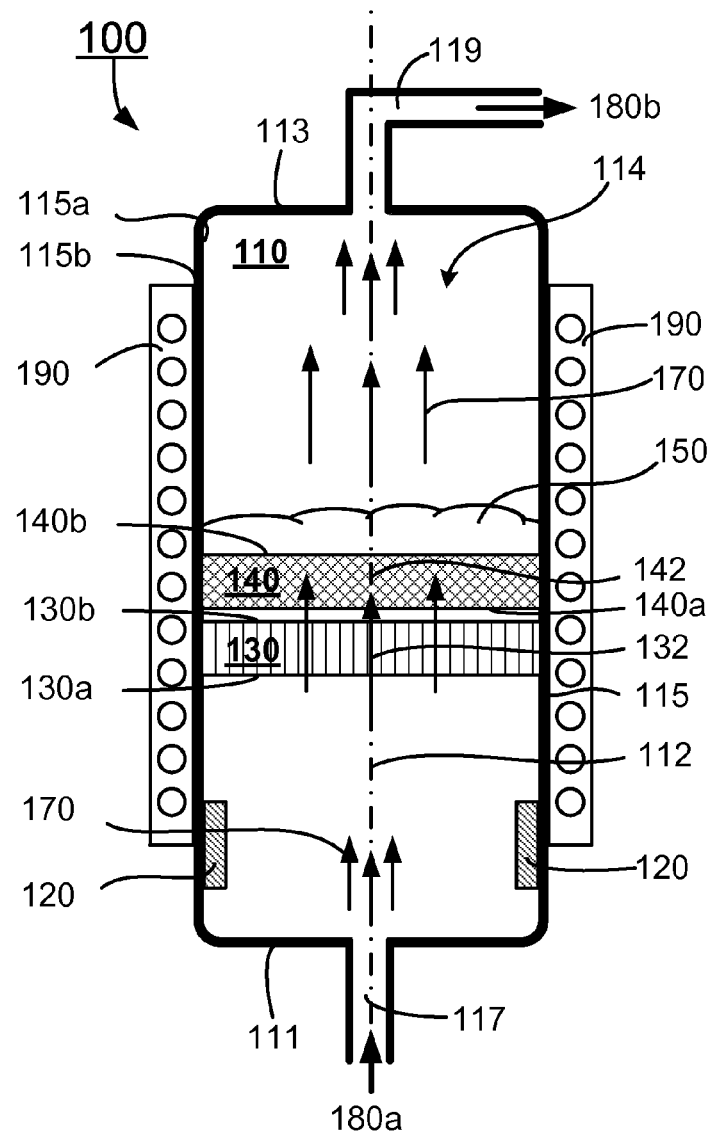
FIG. 2 shows schematically an apparatus for synthesizing nanostructures according to one embodiment of the present invention.

Referring to FIG. 2, an apparatus 200 for synthesizing nanostructures is shown according to one embodiment of the present invention. In this embodiment, the apparatus 200 includes a chamber 210, a heating member 290 for heating the chamber 210 and defining a reaction zone 295 therein, a porous plate 240 placed in the reaction zone 295 for supporting a catalyst 250, a honeycomb-like structure 230 placed next to the porous plate 240 for ensuring a substantially uniform distribution of a gas mixture over the porous plate 240. More specifically, the chamber 210 has a first end 211, an opposite, second end 213, and a body portion 215 defined therebetween, where the body portion 215 has an interior surface 215a defining a cavity 214 therein, an exterior surface 215b and an axis 212 through the cavity 214. The chamber 210 also has a first opening channel 217 interconnecting through the first end 211 in fluid communication with the cavity 214, and a second opening channel 219 interconnecting through the second end 213 in fluid communication with the cavity 214. The first opening channel 217 is adapted for introducing a gas mixture 260 to the cavity 214, and the second opening channel 219 is adapted for outputting an exhaust gas mixture 280 out of the cavity 214, respectively. In one embodiment, the first opening channel 217 and the second opening channel 219 are formed in the form of an inlet tube and an outlet tube that are protruded outwardly along the axis 212 of the cavity 214 from the first end 311 and the second end 213 of the chamber 210, respectively. The chamber 210 in one embodiment is made from graphite. It can also be made from quartz, metal, or a combination thereof.

The gas mixture 260 includes at least one of a carrier gas and a feedstock gas. In one embodiment, the feedstock gas has hydrocarbon. The gas mixture 260 flows from the first opening channel 217 to the second opening channel 219 of the chamber 210 in a direction 270, which may be or may not be against gravity. In the exemplary embodiment shown in FIG. 2, the flowing direction 270 of the gas mixture 260 is opposite to the direction of gravity. The exhaust gas mixture 280 has at least one of a carrier gas and an un-reacted feedstock gas and exits through the second opening channel 219 of the chamber 210.

The heating member 290 can be a thermal oven, an inductive oven, or a combination thereof. In one embodiment, the heating member 290 is an inductive oven containing a number of inductive coils, which is formed on the exterior surface 215b of the body portion 215 of the chamber 210 for heating the chamber 210 thereby creating a substantially isothermal zone 295 in the cavity 214 to ensure a stable, specific temperature required for the catalytic chemical vapor decomposition of hydrocarbons.

The porous plate 240 has a first surface 240a, an opposite, second surface 240b, and an axis 242 and is positioned in the reaction zone 295 in the cavity 214 with the axis 242 being substantially coincident with the axis 212 of the cavity 214 of the chamber 210. The catalyst 150 is deposited on and supported by the second surface 240b of the porous plate 240. The honeycomb-like structure 230 has an axis 232 and is positioned between the first surface 240a of the porous plate 240 and the second end 213 of the chamber 210 with the axis 232 being substantially coincident with the axis 212 of the cavity 214 of the chamber 210. The honeycomb-like structure 230 and the porous plate 240 are adapted such that in use when the gas mixture 260 passes through the honeycomb-like structure 230 and the porous plate 240, the gas mixture 260 is substantially uniformly distributed over the catalyst 250 that is supported by the porous plate 240, thereby enhancing interaction of the gas mixture 260 with the catalyst 250. Carbon nanostructures are generated through the interaction of the gas mixture 260 and the catalyst 250. In one embodiment, the gas mixture 260 after crossing the porous plate 240 causes the catalyst 250 to fluidize such that particles of the catalyst 250 are suspended individually in the gas stream of the gas mixture 260. The apparatus 200 can therefore be referred to as a fluidizing bed-type reactor. The fluidization process is essential for a substantial uniform distribution of the feedstock and improves the overall control of the length, diameter and purity of the resulting carbon nanostructures.

Additionally, the apparatus 200 includes means for vibrating the apparatus 200 so as to improve fluidization of the catalyst interacting with the gas mixture 260.

To further enhance the interaction of the gas mixture 260 with the catalyst 250, the gas mixture 260 may be pre-heated before it enters the chamber 210 of the apparatus 200. Alternatively, the gas mixture 260 may be pre-heated after it enters the chamber 210 with a preheating member 220 that is placed in the cavity 215 of the chamber 210 and between the first end 211 of the chamber 210 and the honeycomb-like structure 230.

The combination of the honeycomb structure 230, the porous plate 240, and the fluidizing stream in the fluidizing bed-type apparatus 200 is used to produce high quality and purity nanostructures with large quantities. The superior performance of the fluidizing bed-type apparatus 200 is achieved through an improved, substantial uniform feedstock gas distribution and an enhanced interaction of the feedstock gas with the catalyst particle 250.

The present invention in one aspect relates to a method for synthesizing nanostructures using the apparatus 200 as disclosed above. In practice, gas mixture 260 introduced through the first opening channel 217 into the cavity 214 of the chamber 210, nanostructures are generated from the interaction of the gas mixture 260 and the catalyst 250 in the reaction zone 295, and the exhaust gas mixture is outputted out of the cavity 214 through the second opening channel 219 of the chamber 210.

Figure 3:
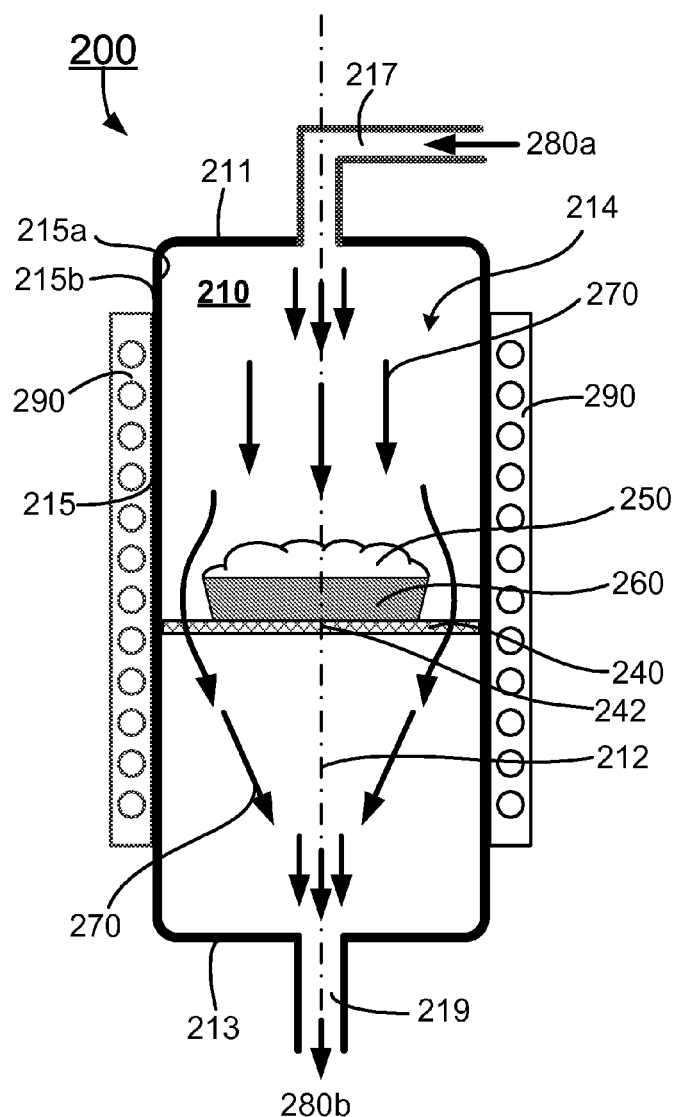
FIG. 3 shows schematically an apparatus for synthesizing nanostructures according to another embodiment of the present invention.

Referring to FIG. 3, an apparatus 300 for synthesizing nanostructures is shown according another embodiment of the present invention. The apparatus 300 has a chamber 310, a heating member 390 formed on the exterior surface 315b of the chamber 310 and defining a reaction zone 395 inside the chamber 310, a susceptor 360 positioned in the reaction zone 395 and filled with a catalyst 350, and a porous plate 340 positioned the reaction zone 395 for supporting the susceptor 360. In the embodiment, the chamber 310 has a first end 311, an opposite, second end 313, and a body portion 315 defined therebetween, where the body portion 315 defines a cavity 314 with an axis 312 and a diameter, $d_1$. The chamber 310 further has a first opening channel 317 interconnecting through the first end 311 in fluid communication with the cavity 314, and a second opening channel 319 interconnecting through the second end 313 in fluid communication with the cavity 314. The first opening channel 317 is adapted for introducing a gas mixture 360 to the cavity 314. The second opening channel 319 is adapted for outputting an exhaust gas mixture 380 out of the cavity 314. In one embodiment, the first opening channel 317 and the second opening channel 319 are formed in the form of an inlet tube and an outlet tube that are protruded outwardly along the axis 312 of the cavity 314 from the first end 311 and the second end 313 of the chamber 310, respectively. The chamber 310 in one embodiment is made from graphite. It can also be made from quartz, metal, or a combination thereof.

The gas mixture 360 includes at least one of a carrier gas and a feedstock gas. In one embodiment, the feedstock gas has hydrocarbon. The gas mixture 360 flows from the first opening channel 317 to the second opening channel 319 of the chamber 310 in a direction 370. In the embodiment shown in FIG. 3, the direction 370 is coincident with the direction of gravity. The exhaust gas mixture 380 has at least one of a carrier gas and an un-reacted feedstock gas and exits through the second opening channel 319 of the chamber 310.

The heating member 390 can be a thermal oven, an inductive oven, or a combination thereof. In one embodiment, the heating member 390 is an inductive oven containing a number of inductive coils, which formed on the exterior surface 315b of the chamber 310 for heating the chamber 310 thereby creating a substantially isothermal zone 395 in the cavity 314. The temperature in the isothermal zone 395 is substantially uniformly distributed.

The porous plate 340 has an axis 342 and is positioned in the reaction zone 395 with the axis 342 being substantially coincident with the axis 312 of the cavity 314 of the chamber 310. The susceptor 360 has a body portion defining a recess therein and is placed in the reaction zone 395 and supported by the porous plate 340. The recess is at least partially filled with the catalyst 350. The porous plate 340 and the susceptor 360 are adapted such that when the gas mixture 360 passes through the susceptor 360, the interaction of the gas mixture 360 with the catalyst 350 in the susceptor 360 produces nanostructures and causes the susceptor 360 to fill and overflow with the produced nanostructures, which then are collectable through the second end 313 of the chamber 310. In one embodiment shown in FIG. 3, the susceptor 360 is sized with a diameter, $d_2$, which is less than the diameter $d_1$ of the cavity 314 of the chamber 310 such that when the susceptor 360 is placed on the porous plate 340, there is a space formed between an edge of the susceptor 360 and the interior surface 315a of the chamber 310, which allows the produced nanostructures overflown from the susceptor 360 and the exhaust mixture gas to pass through. In one embodiment, the porous plate 340 is made of metal mesh. The susceptor 360 is made from graphite, ceramic, metal, or a combination thereof.

Additionally, the apparatus 300 may have a honeycomb-like structure placed between the first end 311 of the chamber 310 and the susceptor 360 for improving uniform distribution of the gas mixture. The apparatus 300 may also have means for vibrating the apparatus 300 so as to improve fluidization of the catalyst interacting with the gas mixture 360. The reactor 300 can be referred to as an impaction-type reactor.

In operation, the gas mixture 360 is introduced through the first opening channel 317 into the cavity 314 of the chamber 310. The introduced gas mixture 360 interacts with the catalyst 350 in the susceptor 360 placed in the isotheromal zone 395 that is heated at a predetermined temperature, hereby generating nanostructures in the susceptor 360. As the interaction time evolves, the generated nanostructures fill in and overflow from the susceptor 360. The generated nanostructures overflown from the susceptor 360 are then collected through the second end 313 of the chamber 310.

Figure 4:
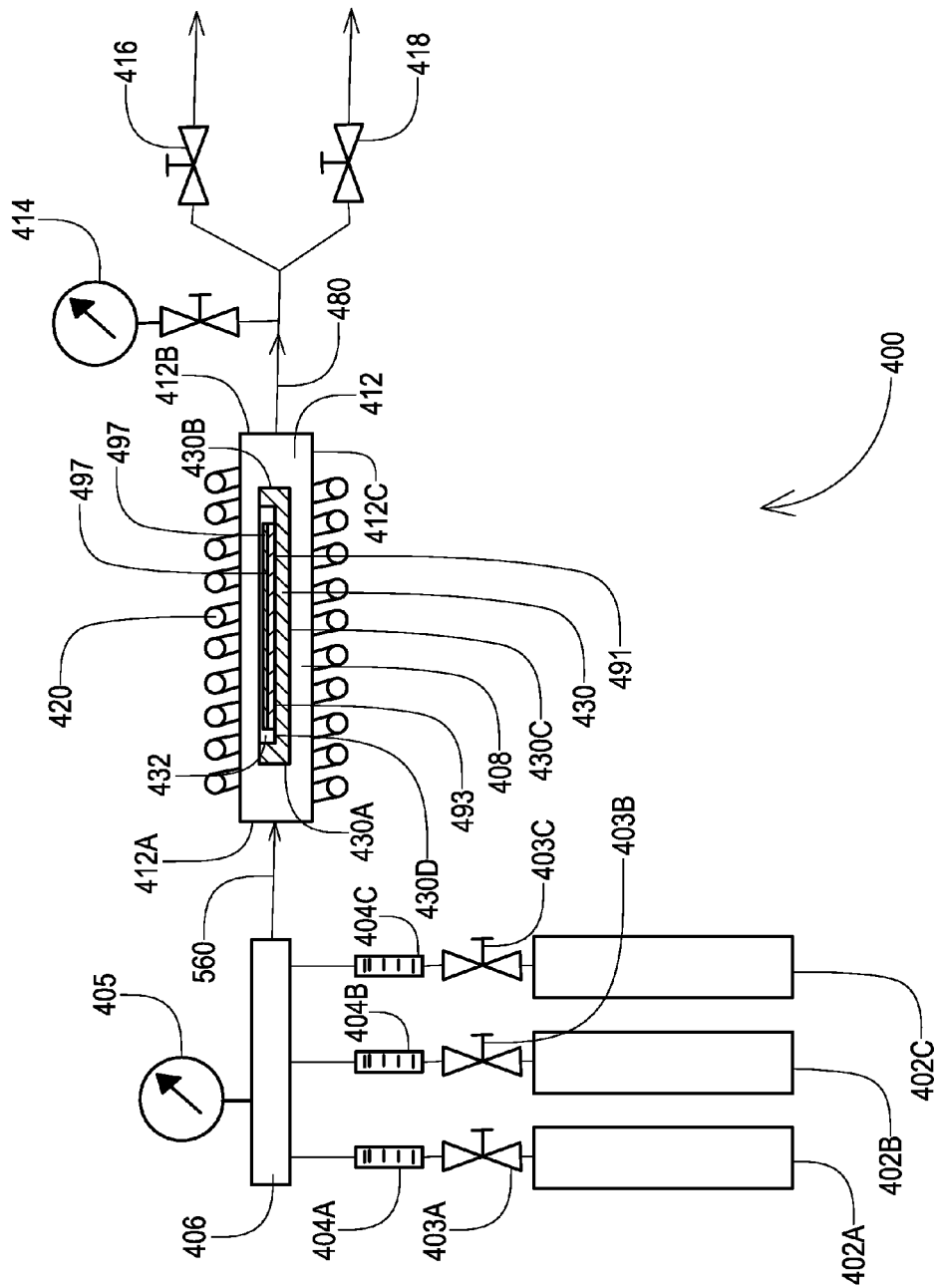
FIG. 4 shows schematically an apparatus for synthesizing nanostructures according to yet another embodiment of the present invention.

Referring to FIG. 4, an apparatus 400 for synthesizing nanostructures is shown according to one embodiment of the present invention. In this embodiment, the apparatus 400 has a chamber 412, a heating member 420 formed on the exterior surface of the chamber 412 defining a reaction zone 408 that is located within the confines of the chamber 412, a susceptor 430 that has a recess 432 and is placed in the reaction zone 408, and a semiconductor plate 491, which has a film 497 of a catalyst, placed in the recess 432 of the susceptor 430.

As shown in FIG. 4, the chamber 412 has a first end 412a, an opposite, second end 412b, and a body portion 412c defined therebetween. The chamber 412 in one embodiment is in the form of a tube and is made of quartz.

The susceptor 430, in one embodiment is a conductive susceptor that has a first end 430a and an opposite, second surface 430b defining a body portion 430c therebetween. The body portion 430c defines a recess 432 therein with a bottom surface 430d. The conductive susceptor 430 can be made of a substantially conductive material. In one embodiment, the conductive susceptor 430 is made of a substantially conductive material that is chemically compatible to carbon and its compounds, which means this material does not significantly affect or interfere with chemical properties of the carbon-based nanostructures. One substantially conductive material that is chemically compatible to carbon and its compounds is graphite, which has been used as a preferred material for the conductive susceptor 430. Alternatively, the substantially conductive material comprises at least one of metals, alloys, and ferromagnetic materials. For examples, titanium, stainless steel, iron, molybdenum, and any of their combinations can be used to practice the present invention.

The semiconductor plate 491, which has a film 497 of a catalyst at least partially covering a first surface 495 of the semiconductor plate 491, is placed in the recess 432 and supported by the bottom surface 430d of the susceptor 430 such that a second surface 493 of the semiconductor plate 491, which is opposite to the first surface 495 of the semiconductor plate 491, is in contact with the bottom surface 430d of the susceptor 430. The semiconductor plate 491 having a film 497 of a catalyst and the susceptor 430 are adapted such that when a gas having hydrocarbon passes through the cavity of the chamber 412, the interaction of the gas having hydrocarbon with the film 497 of a catalyst produces carbon nanostructures. In one embodiment, the semiconductor plate 491 is made of Si.

In one embodiment, the heating member 420 has a conductive inductor in the form of inductor coils 420. The conductive inductor is electrically coupled to an AC power supply (not shown). In one embodiment, the conductive inductor is configured such that, in operation, it allows an alternating current to pass through to generate an electromagnetic field with a frequency at least in the reaction zone 408 and induce current in the conductive susceptor 430 so as to generate a heat flow from the conductive susceptor 430 to the body portion 412c of the chamber 412 to allow nanostructures to be grown in the chamber 412. The frequency is in the range of Radio Frequency (RF). The thermal gradient from the conductive susceptor 430 is transferred to the semiconductor plate 491 and the film 497 of a catalyst, therefore greatly increasing the efficiency of heat transfer to the catalyst. Further, the recess 432 of the susceptor 430 and/or the semiconductor plate 491 are/is configured such that when the semiconductor plate 491 is placed in the recess 432, as shown in FIG. 4, there are spaces between the semiconductor plate 491 and the walls of the body portion 430c that define the recess 432, which allows good heat circulation around the semiconductor plate 491.

Furthermore, the apparatus 400 has means for regulating a flow rate of the gas mixture 460 containing an aerosolized catalyst 402a and a feedstock 402b to allow the catalyst to spend the sufficient amount of time in the reaction zone 408 for the growth of nanostructures having specific dimensions, number of walls, and other desired features. In one embodiment, the gas mixture 460 also contains a carrier gas 402c. The regulating means, in one embodiment, includes at least three gas regulators. Each gas regulator has a source 402a, 402b or 402c associating with a corresponding one of an aerosolized catalyst 402a, a feedstock gas 402b and a carrier gas 402c, a vale 403a, 403b or 403c in communication with the source for controlling a flow rate of a gas from the source, and a flow meter 404a, 404b or 404c in communication with the vale for monitoring the flow rate therethrough. The regulating means also includes a gas chamber 406 that produces the gas mixture 460 that includes the aerosolized catalyst 402a, the feedstock gas 402b, and the carrier gas 402c output from the at least three gas regulators, and a pressure gauge 405 in communication with the gas chamber 406 for monitoring a pressure of the gas mixture 460 transporting into the chamber 412 from the first end 412a of the chamber 412.

Additionally, the apparatus 400 includes a pressure gauge 414 positioned at the second end 412b of the chamber 412 for monitoring a pressure of the exhaust gas 480 out of the chamber 412, and at least a gas output valve 416 and a vacuum line 418 coupled with the pressure gauge 414 for outputting the exhaust gas 480.

Figure 8:
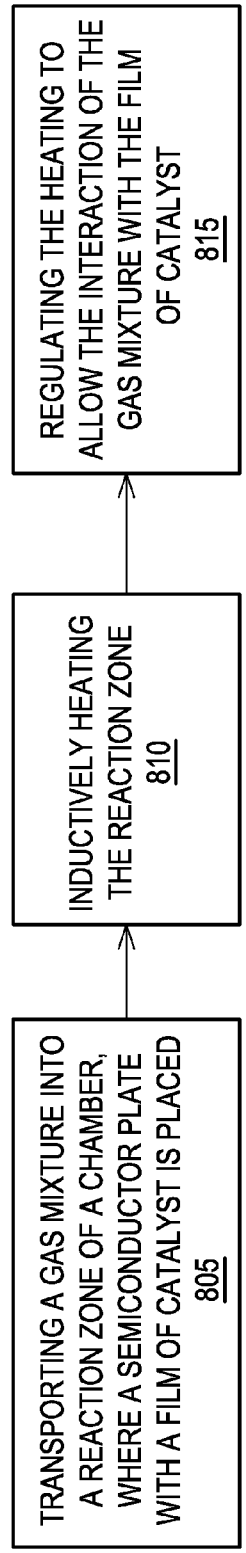
FIG. 8 shows a flow diagram illustrating a method that relates to embodiments of the present invention.

One of embodiments of the present invention relates to a method for the production of nanostructures in the chamber 412 having a reaction zone 408 and a conductive susceptor positioned in the reaction zone 408, where a semiconductor plate 491 having a film 497 of a catalyst is placed in the reaction zone such that the semiconductor plate 491 is supported by the conductive susceptor 430. Referring in general to FIGS. 8 and 4, the method includes the following steps: At step 805 a gas mixture 460 having an aerosolized catalyst 402a, a feedstock 402b and a carrier gas 402c is transported into the reaction zone 408 of the reactor 400, inductively heating the reaction zone 408. At step 810, the reaction zone 408 is inductively heated by the heating member 420 including inductive coils 210. At step 815, the heating is regulated so that the temperature of the conductive susceptor 430 increases from a first temperature to a second temperature when the gas mixture is introduced into the cavity of the chamber 412 to allow nanostructures to be grown from the interaction of the gas mixture with the film 497 of a catalyst of the semiconductor plate 491. The heating can be regulated through the steps of turning on the heating member 420 so that the temperature of the susceptor 430 reaches a first temperature, increasing the temperature of the susceptor 430 from the first temperature to a second temperature when the gas mixture is introduced into the cavity of the chamber 412, and keeping the temperature of the susceptor 430 substantially at the second temperature when nanostructures are generated. In one embodiment, the first temperature is below about 700° C., and the first temperature is above about 700° C.

Optionally, a flow rate of the gas mixture can be regulated to allow the catalyst to spend a sufficient amount of time in the reaction zone 408 for the growth of nanostructures. In one embodiment, the inductively heating step (step 810) comprises the step of inducing current in the conductive susceptor so as to generate a heat flow from the conductive susceptor. The regulation of the flow rates of the carrier gas 402c, aerosolized catalyst 402a and carbon feedstock 402b is performed with flow-meters 404a, 404b and 404c, respectively. In additional embodiments other predetermined elemental feedstocks may be substituted for the carbon feedstock.

Figure 5:
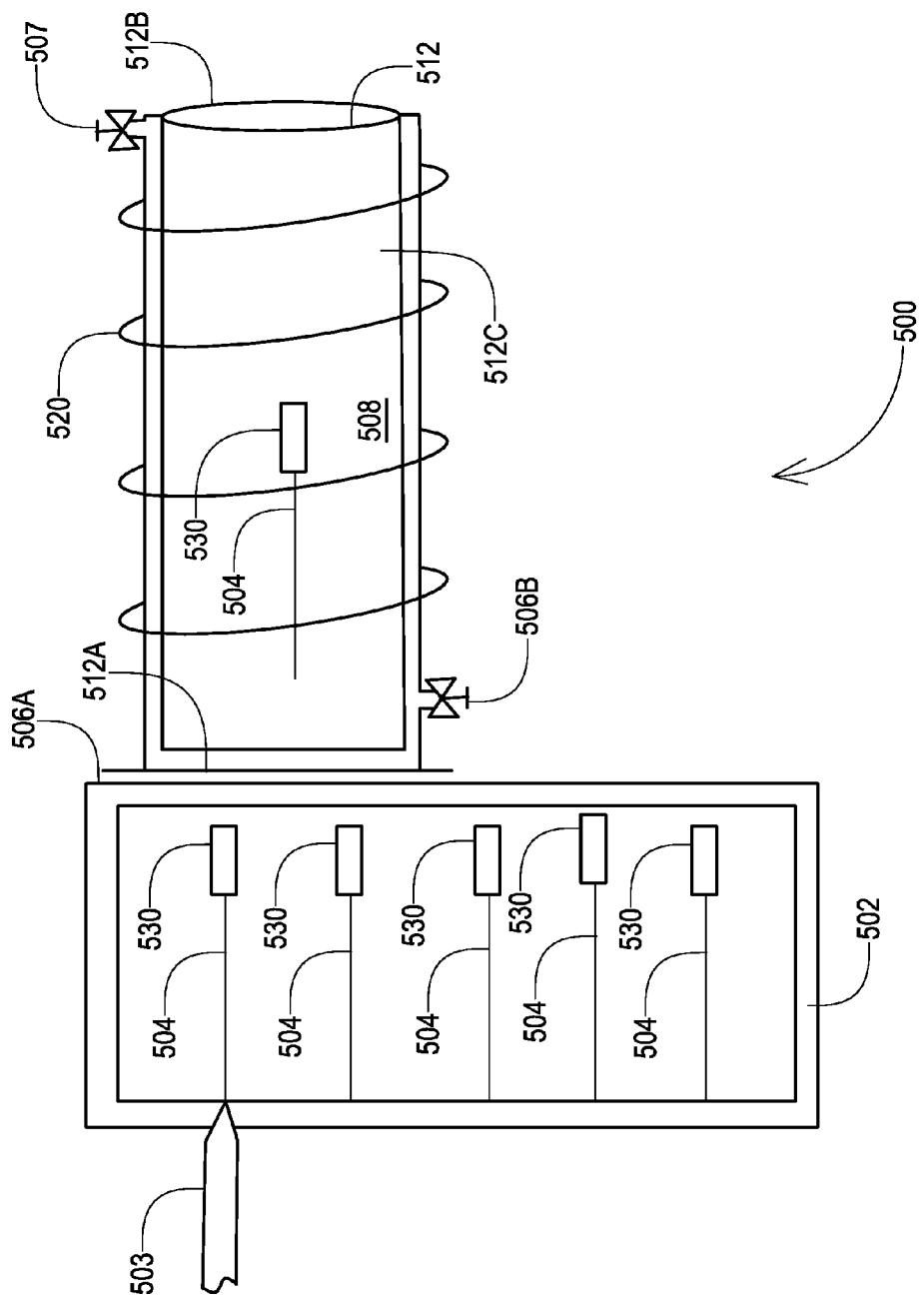
FIG. 5 shows schematically an apparatus for synthesizing nanostructures according to an alternative embodiment of the present invention.

FIG. 5 illustrates an apparatus 500 for synthesizing nanostructures according to another embodiment of the present invention. In this embodiment, the apparatus 500 has a reactor 510 having a reaction zone 508, and means for consecutively introducing batches of a catalyst to the reaction zone 508, where each batch of the catalyst is positioned in the reaction zone 508 for a period of time for the growth of nanostructures.

In one embodiment, the reactor 510 has a chamber 512 having a first end 512a, an opposite, second end 512b, and a body portion 512c defined therebetween. The chamber 512 is in the form of a tube and is made of quartz. The reactor 510 also has a trap door/valve 506a and a gas inlet valve 506b positioned at the first end 512a of the chamber 512, where the trap door/valve 506a and the gas inlet valve 506b are configured such that when the trap door/valve 506a is open, the gas inlet valve 506b is close, and vice versa. The trap door/valve 506a functions to keep air out of the reaction zone 508 in addition to keeping hydrocarbon feedstock out of the carousel chuck 502. Furthermore, the reactor 510 has a one-way gas exit valve 507 positioned at the second end 512b of the chamber 512 for outputting an exhaust gas out of the reaction zone 508, and a heating member 520 formed on the exterior surface of the body portion of the chamber 512 defining the reaction zone 508 of the reactor 500. The introducing means in one embodiment includes a carousel type chuck 502. The carousel type chuck 502 includes a plurality of susceptor receptacles secured and arranged in a circular configuration within the chuck 502, and an arm 503 engaged with the plurality of susceptor receptacles. Each susceptor receptacle includes a supporting extension member 504 and a corresponding susceptor 530 for supporting a catalyst. In one embodiment, the supporting extension member 504 is adapted for placing a batch of the catalyst supported by a corresponding susceptor 530 in the reaction zone 508 from the trap door/valve 506a of the reactor 500 for a period of time to facilitate the growth of nanostructures.

Once a respective receptacle inserting process is completed, another susceptor receptacle is introduced into the reaction zone 508 by rotating the carousel chuck 502 into a predetermined position, thereafter the arm 503 is engaged to move the susceptor 503 with catalyst into the reaction zone 508. The susceptor 530 with catalyst may take the form of a conductive susceptor 430 with a recess 432 and a semiconductor plate 491 with a film 497 of catalyst placed in the recess 432. This aspect of the present invention may be accomplished using a pneumatic, hydraulic or electrical device (not shown) to rotate the carousel chuck 502 and extend and retract the arm 503. This process enables increased production of nanostructures while still maintaining high quality and purity of the resultant products.

Figure 9:
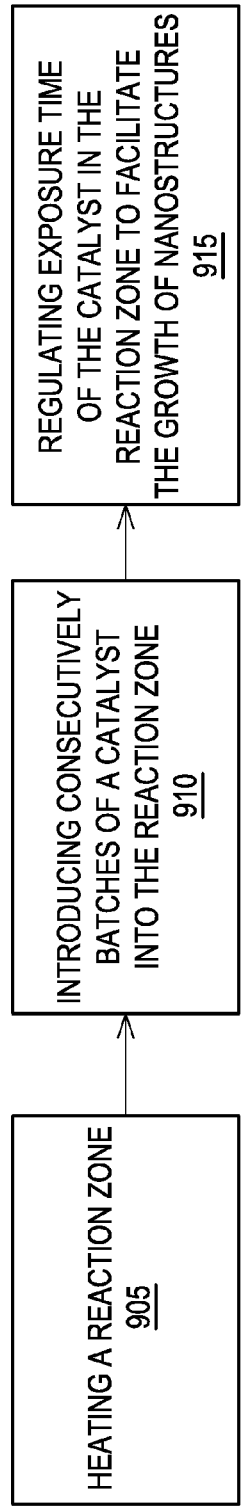
FIG. 9 shows a flow diagram illustrating a method that relates to embodiments of the present invention.

In one aspect, the present invention relates to a method synthesizing nanostructures in the apparatus 500 that includes a reactor 512 having a reaction zone 508. FIG. 9 shows a flow chart of the method comprising the following steps: at step 905, the reaction zone 508 of the nanostructure reactor 512 is heated. At step 910, batches of a catalyst are consecutively introduced into the reaction zone 508 from the first end 512a of the nanostructure reactor 512. At step 915, the exposure time of the catalyst in the reaction zone 508 is regulated to facilitate the growth of nanostructures having desired features. In one embodiment, the heating step is performed with a thermal oven or an inductive oven, and the introducing step is preformed using a carousel shaped chuck 502.

Figure 6:
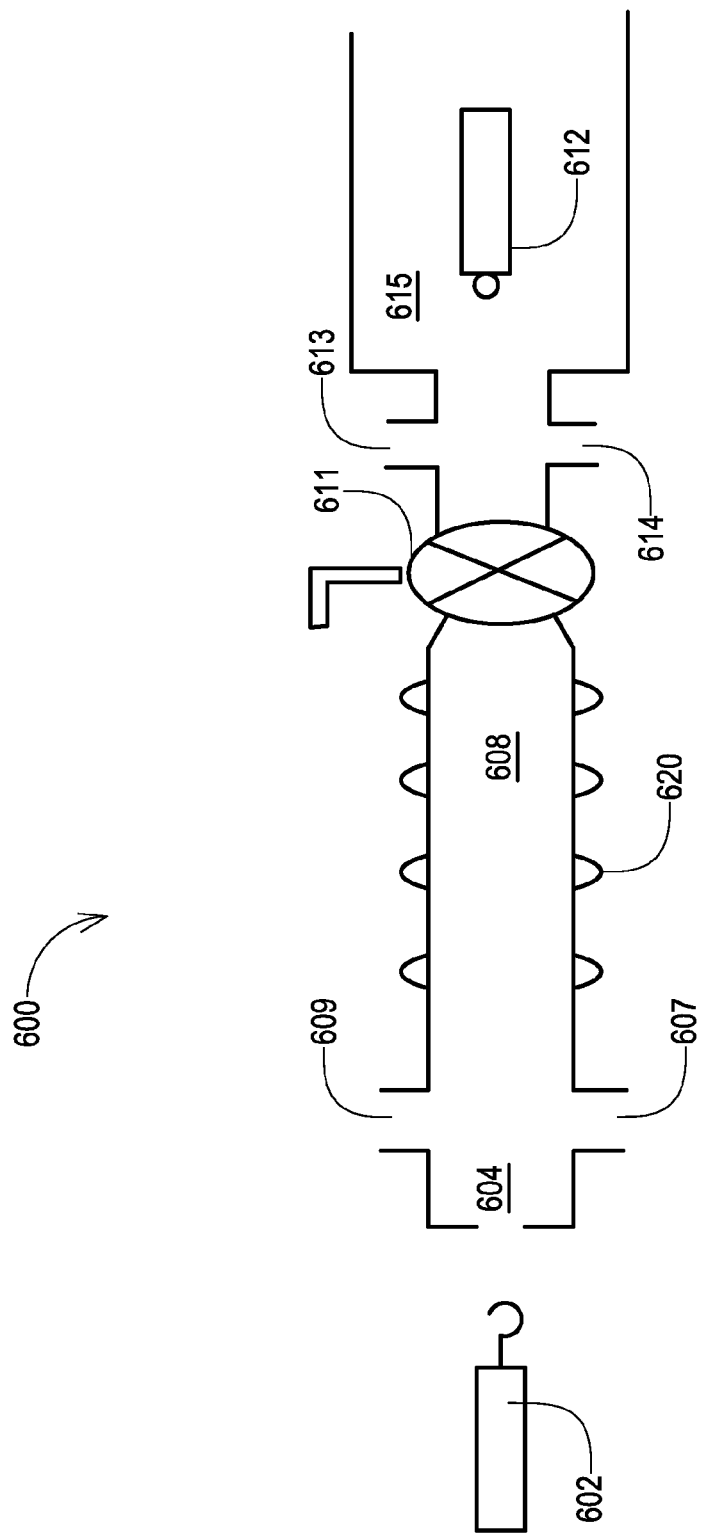
FIG. 6 shows schematically an apparatus for synthesizing nanostructures according to one embodiment of the present invention.

Referring to FIG. 6, an apparatus 600 having a reactor 610 with a reaction zone 608, and means for consecutively introducing batches of a catalyst to the reaction zone 608 is shown according to an alternative embodiment of the present invention, where each batch of the catalyst is positioned in the reaction zone 608 for a period of time for the growth of nanostructures having desired features.

In one embodiment, the reactor 610 includes a first end portion 601 and an opposite, second end portion 603, defining a first entry way and a second entry way, respectively. The reaction zone 608 in one embodiment is located with the confines of the reactor 610 and between the first end portion 601 and the second end portion 603. The reactor 610 further includes a first airlock 604 and a second airlock 615 positioned at the first end portion 601 and the second end portion 603, respectively. The first airlock 604 and a second airlock 615 are used to maintain a constant flow rate for the carrier and hydrocarbon or other feedstock gases inside the reactor area 608 during the insertion or removal of receptacles. The reactor 610 also includes an inlet ball valve 611 positioned between the reaction zone 608 and the second airlock 615 for sealing the airlock 615. The inlet ball valve 611 is used to seal the second airlock 615, which enables the introduction of a new susceptor receptacle into the reactor 610 without upsetting the fluid dynamics inside of the reaction zone 608. Furthermore, the reactor 610 includes a first input port 609 and a first output port 607 that are positioned between the first airlock 604 and the reaction zone 608 for inputting and outputting a carrier gas, respectively. Moreover, the reactor 610 includes a second input port 613 and a second output port 614 that are positioned between the inlet ball valve 611 and the second airlock 615 for inputting and outputting a gas mixture of a carrier gas and a feedstock gas, respectively. Additionally, the reactor 610 includes a heating member 620 formed on the reactor 600 for heating the reaction zone 608. As in other embodiments of the present invention the reaction zone 608 can be heated by way of the inductor coils 620 or conventional thermal heating methods.

In one embodiment, the introducing means has a first set of susceptor receptacles 602 and a second set of susceptor receptacles 612. Each susceptor receptacle 602 or 612 is adapted for containing a batch of a catalyst. In one embodiment, the first set of susceptor receptacles 602 and the second set of susceptor receptacles 612 are consecutively introduced into the reaction zone 608 of the reactor 600 from the first entry way and the second entry way of the reactor 610, respectively. The first entry way and the second entry way are formed at the first end portion 601 and the second end potion 603 of the reactor 610, respectively. Once the introducing process of one of the first set of susceptor receptacle 602 is completed, one of the second set of susceptor receptacle 612 is introduced into the reaction zone 608 of the reactor 610, and vice versa.

Figure 10:
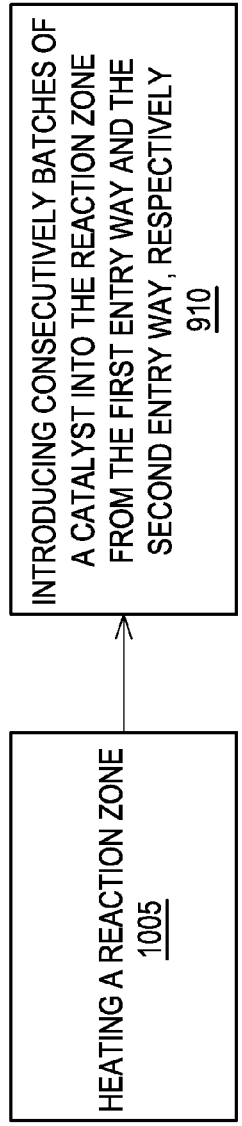
FIG. 10 shows a flow diagram illustrating a method that relates to embodiments of the present invention.

FIG. 10 shows a flow chart of a method for synthesizing nanostructures in a reactor 610 having a first entry way and an opposite, second entry way defining a reaction zone 608 therebetween, and a first airlock 604 at a first end of the nanostructure reactor 600 and a second airlock 615 situated at a second end of the nanostructure reactor 600. In the embodiment, the method includes the following steps: at step 1005, the reaction zone 608 of the nanostructure reactor 610 is heated. At step 1010, batches of a catalyst are consecutively introduced into the reaction zone 608 from the first entry way and the second entry way, respectively. In one embodiment, the method further includes the step of regulating exposure time of the catalyst in the reaction zone 608 to facilitate the growth of nanostructures. Aspects of the present embodiment provide steps for maintaining a constant flow rate for a carrier gas and a carbon feedstock inside the nanostructure reactor 600. Further aspects provide for the maintaining of a constant flow rate by the use of at least one of the first air lock 604 and the second airlock 615.

Figure 7:
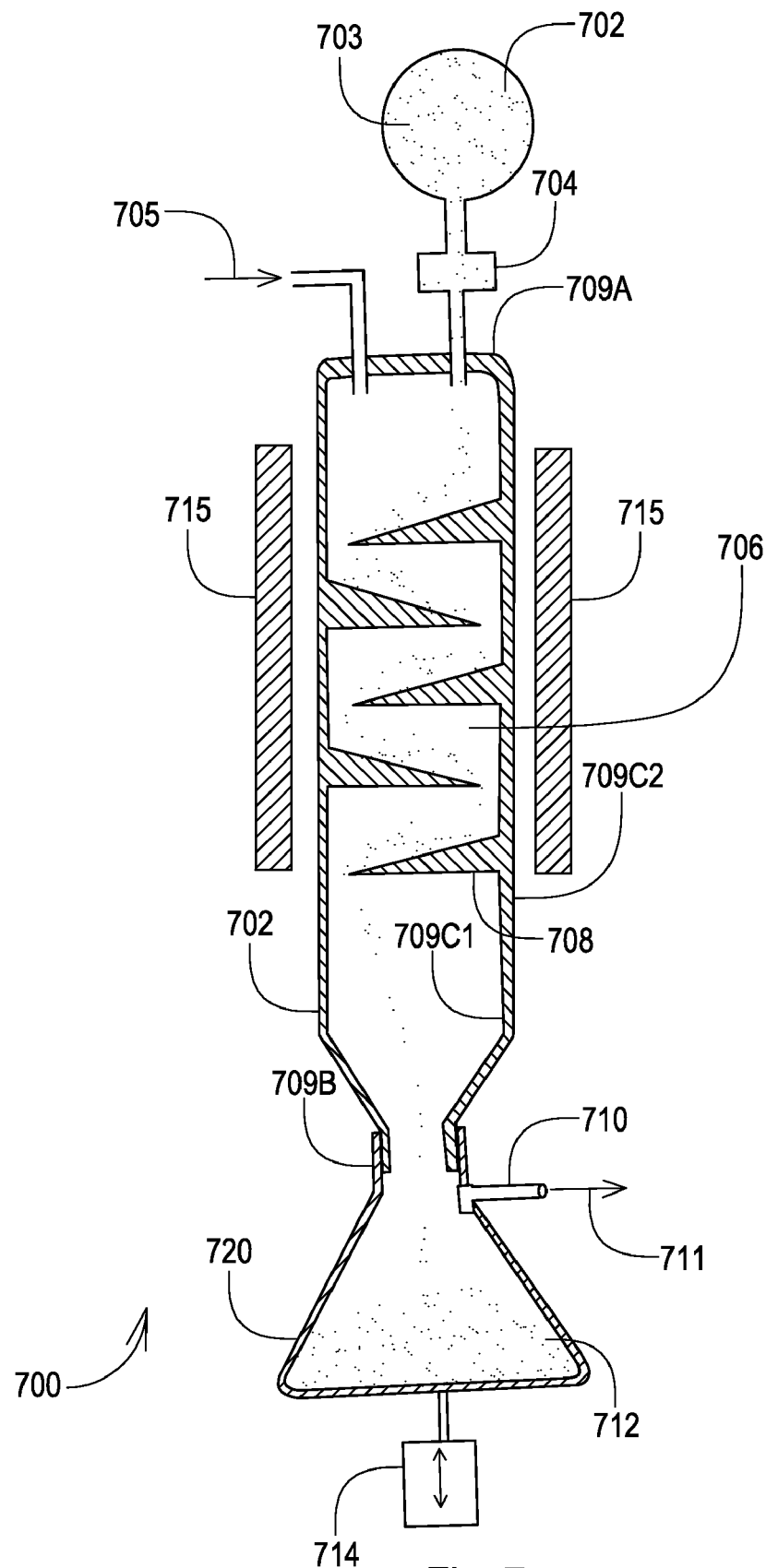
FIG. 7 shows schematically an apparatus for synthesizing nanostructures according to another embodiment of the present invention.

FIG. 7 illustrates another embodiment of the present invention. The apparatus 700 as illustrated in FIG. 7 provides for the consecutive introduction of batches of a catalyst 703 to a reaction zone 706. In the embodiment, the apparatus 700 has a chamber 709 having a first end 709a, an opposite, second end 709b, and a body portion 709c defined therebetween. The body portion 709c has an interior surface 709c1 and an exterior surface 709c2. The apparatus 700 also includes a heating member 715 that is formed on the exterior surface 709c2 of the body portion 709c of the chamber 709, hereby defining a reaction zone 706 inside the chamber 709. Furthermore, the apparatus 700 includes a plurality of baffles 708 protruding inwardly from the interior surface 709c1 of the body portion 709c of the chamber 709 in the reaction zone 706. In one embodiment, the baffles 708 are configured in a staggered descending vertical arrangement, where each consecutive baffle 708 is located on a side that is opposite to that of its predecessor. Each of the baffles 708 further comprises a downward sloping shape for allowing for any material that is deposited upon a baffle 708 to be easily transferred to a lower level baffle 708.

Moreover, the apparatus 700 includes a catalyst tank 702 positioned proximate to the first end 709a of the chamber 709 for introducing batches of a catalyst 703 in a powder form to the reaction zone 706. The catalyst tank 702 contains the catalyst powder 703. The catalyst tank 702 is further equipped with a catalyst feeder 704 that is in communication with the catalyst tank 702, where the catalyst feeder 704 vertically controls the introduction of catalyst powder 703 into the reaction zone 706. Additionally, the apparatus 700 includes an input valve 701 positioned at the first end 709a of the chamber 709 for introducing a mixture 705 containing a feedstock gas and a carrier gas to the reaction zone 706.

In operation, a stream of catalyst powder 703 is introduced into the reaction zone 706, the stream of catalyst powder 703 is deposited upon and sifted between the pluralities of baffles 708 to facilitate the growth of nanostructures. The mixture 705 including hydrocarbon or other types of feedstock and a carrier gas are input to the chamber 709 via an input valve 706. The chamber 709 and the reaction zone 706 are heated by way of an inductor heater 715 or conventional thermal heating methods. The catalyst powder 703 is transferred between baffles 708 with the aid of a vibration inducing mechanism 714 that is in mechanical contact with the apparatus 700. The vibration inducing mechanism vibrates the chamber 709, thus the vibrations along with gravity provides the force that is needed to sift the catalyst powder 703 from one baffle 708 to another baffle 708 through the reaction zone 706.

The apparatus 700 further has a collector 720 in communication with the second end 709b of the chamber 709 for collecting nanostructures 712, and means for outputting an exhaust gas mixture 711 out of the chamber 709. In one embodiment, the outputting means includes an output vale 710 for controlling output of the exhaust gas mixture 711.

A further aspect of the present invention relates to a method for synthesizing nanostructures including the step of consecutively and vertically introducing batches of catalyst to the reaction zone 706. Thereafter, the catalyst is deposited upon and sifted between the pluralities of baffles 708 that are situated within a reaction zone 706. The catalyst is transferred from one baffle to another baffle with the aid of a vibration inducing mechanism that is contact with the reactor 700.

Any of the above-mentioned embodiments alone or in combination will permit the continuous production of nanostructures. Further, any other methods that achieve the same result by controlling the above-mentioned pertinent factors are encompassed within the scope of this invention.

These and other aspects of the present invention are further described below.

EXAMPLES AND IMPLEMENTATIONS OF THE INVENTION

Without intent to limit the scope of the invention, exemplary methods and their related results according to the embodiments of the present invention are given below. Note again that titles or subtitles may be used in the examples for convenience of a reader, which in no way should limit the scope of the invention. Moreover, certain theories are proposed and disclosed herein; however, in no way they, whether they are right or wrong, should limit the scope of the invention.

One aspect of the present invention utilizes the discovery of the fact that the interaction between the catalyst and the Si wafer plays an important role in the growth and alignment of CNTs. Fe catalyst was shown to be active for CNT growth on different substrates and its interaction with $SiO_2$ is very strong. For a continuous growth, the CNTs have to overcome the interactions between the catalyst nano-particles and the substrate surface. The RF generator provides a very fast heating rate which could assist the nanotubes to lift the nano-particles and allow them to float. The examples are given below for the growth of very long horizontally aligned SW, DW and MWCNTs on flat substrates, using Radio-Frequency (RF) chemical vapor deposition method according to embodiments of the present invention. Different catalytic systems as well as different hydrocarbons were used to grow long and horizontally aligned CNTs. Note that the words "film" and "wafer" may be used interchangeably.

Example 1

This example illustrates how catalyst preparation was done in connection with the present invention.

For one embodiment of this invention, the catalyst was prepared using a sol-gel method. First, 181.8 mg of iron nitrate ($Fe(NO_3)_3 \cdot 9H_2O$) (molecular weight=404), which corresponds to 0.45 mM iron nitrate aqueous solution, was dissolved into ethanol and continuously sonicated until a homogeneous solution was achieved. Next, 50 μl of tetra-ethyl-ortho-silicate (TEOS) was added to the nitrate solution and sonicated for a good dispersion. Note that the same procedure can be followed when other metals are involved.

Before the catalyst deposition, a Si wafer, which is used as a semiconductor plate 491 in connection with the embodiment shown as FIG. 4, can be cut to the desired dimensions using a diamond knife and thoroughly cleaned with ethanol to make sure that no contaminants or fingerprints are present on its surface. For the examples shown here, the Si wafer was cut into a square with dimensions 1.1 cm×1.1 cm. About 6.05 μl of the final catalyst solution was deposited onto the oxidized Si wafer using a precise pipette and allowed to form a thin film of catalyst, which is corresponding to a film 497 of catalyst in connection with the embodiment shown as FIG. 4. Subsequently, the Si wafer with the film of catalyst was placed in refrigerator for 30 minutes to ensure that the solution spreads into a homogeneous thin layer on top of the Si wafer. Later, the Si wafer was placed in oven at about 100° C. for 1 hour, to ensure that the catalyst solution was completely dried (on top of the wafer). The amount of the catalyst solution deposited onto the Si wafer was varied and its affect on the CNT morphology, growth rate and diameter dimensions was thoroughly studied.

For this invention, in addition to Fe catalyst, a conditioning catalyst ($Mo/Al_2O_3$), was utilized for the nanotube growth. The conditioning catalyst was prepared as follows: around 500 mg of $(NH_4)_6Mo_7O_{24} \cdot 4H_2O$ was dissolved into ethanol and sonicated for 20 minutes. Next, 10 gr of Aluminum Oxide ($Al_2O_3$) was added to the solution and sonicated for one hour until a homogeneous dispersion was achieved. Next, ethanol was evaporated in air and the catalyst was calcinated at 500° C. for 12 hours.

Example 2

This example describes how the CNT synthesis was done according to one embodiment of the present invention.

In this example, the CNTs were grown by using a RF catalytic chemical vapor deposition (CCVD) in connection with the embodiment shown as FIG. 4. A graphite boat, which is corresponding to a susceptor 430 and contains the Si wafer with the film of catalyst, is placed in the middle of a quartz tube, which is corresponding to the chamber 412, and heated up by an RF generator as a heating member. The size of the quartz tube can vary depending on the dimensions of the generator. First the tube is flushed with Argon (Ar), which in this case is the carrier gas, for about 10 minutes at 100 ml/min. Next, the RF generator is turned on and when the temperature of the graphite boat reaches about 650° C., hydrogen ($H_2$) gas is flown at 60 ml/min (for 45 minutes) to reduce the catalyst. Subsequently, the power of the RF generator was increased so that the temperature reached 720° C., which is the CNT growth temperature in this particular case. At that time, acetylene ($C_2H_2$) at 4.8 ml/min was added for 30 minutes. Finally, RF generator was turned off along with $C_2H_2$ and $H_2$, and the product was cooled down under the presence of Ar for about 10 minutes. Similarly, other synthesis were performed at 780° C., utilizing acetylene as hydrocarbon source.

Methane was utilized at a hydrocarbon source when the conditioning catalyst was used to assist the CNT growth. First the tube is flushed with Ar and the catalyst is reduced at the same conditions as set forth above. The conditioning catalyst ($Mo/Al_2O_3$) was placed (at the furnace entrance) in front of the Si wafer which is covered with a thin layer of Fe catalyst solution. Next, the power of the RF generator was increased so that the temperature reached 850° C., and methane ($CH_4$) was introduced at 60 ml/min for 30 minutes. The conditioning catalyst breaks up the methane molecule and as a result the yield of nanotubes increases as the hydrocarbon is utilized more efficiently.

The CNTs grown on the Si wafer were analyzed by AFM, SEM and Raman Spectroscopy. The influence of temperature and the type of hydrocarbon on the CNT morphology and growth rate is also discussed.

Example 3

This example describes AFM analysis in connection with the CNTs grown according to one embodiment of the present invention.

Figure 11:
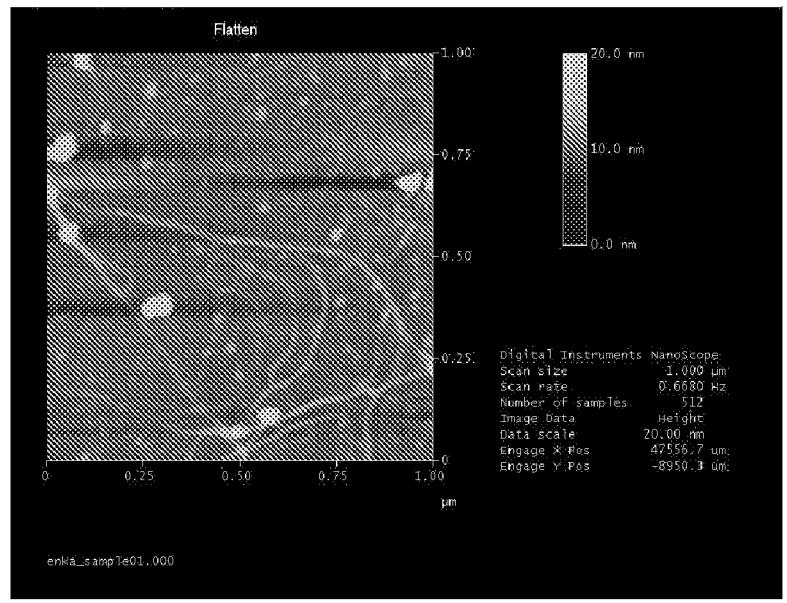
FIG. 11 displays an AFM image of long CNTs grown at 720° C. with acetylene.
Figure 12:
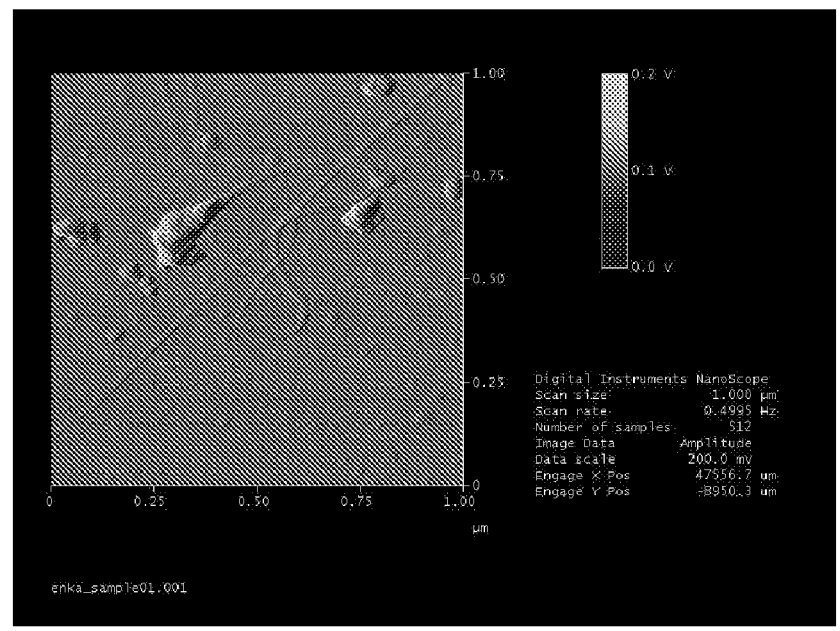
FIG. 12 displays an AFM image of long CNTs growing out of the catalyst at 780° C.
Figure 13:
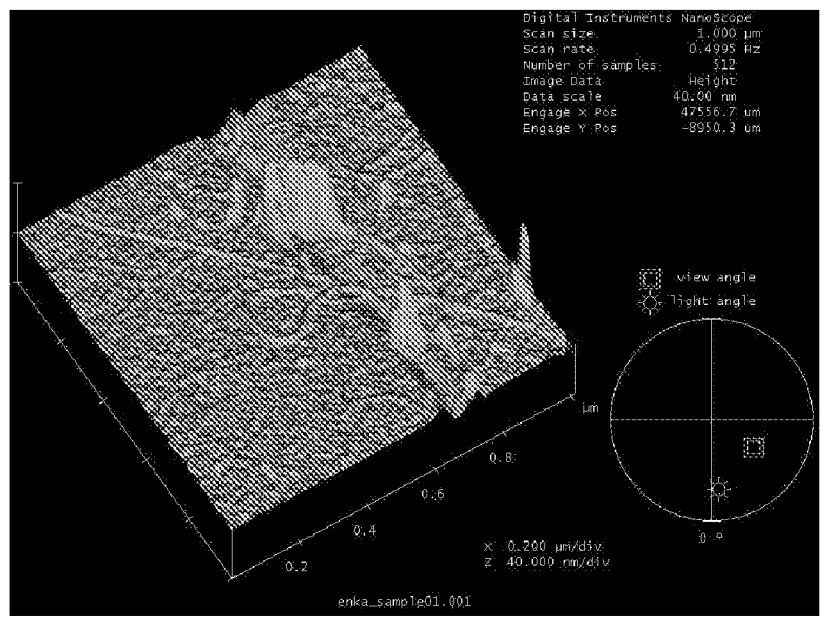
FIG. 13 displays a 3D AFM image of CNTs grown at 780° C. with acetylene.

After the CNTs were grown on the oxidized Si film, Atomic Force Microscope (AFM) was used to analyze the morphology of the samples. FIG. 11 shows the AFM image of the long CNTs grown at 720° C. with acetylene. The CNTs are horizontally oriented and their length is in hundreds of μm range. FIG. 12 shows the AFM image of the CNTs growing out of the catalyst system which is immersed in TEOS. In this case the CNTs are grown at 780° C. using acetylene as hydrocarbon source. FIG. 13 shows a 3D view of the image that is presented in FIG. 12. The AFM images demonstrate that the CNTs are pretty long but not all of them are horizontally aligned on the Si wafer. An explanation of this could be due to the catalyst not being homogeneously dispersed on the Si wafer, causing a random growth and alignment of nanotubes. A potential way to homogeneously disperse the catalyst solution is through patterning the surface of the Si wafer. The patterning can be done through different methods such as photolithographic techniques, shadow masking, nano-lithography and many more. More experiments have to be conducted in order to achieve a perfect alignment of CNTs.

Example 4

This example describes SEM analysis in connection with the CNTs grown according to one embodiment of the present invention.

Figure 14:
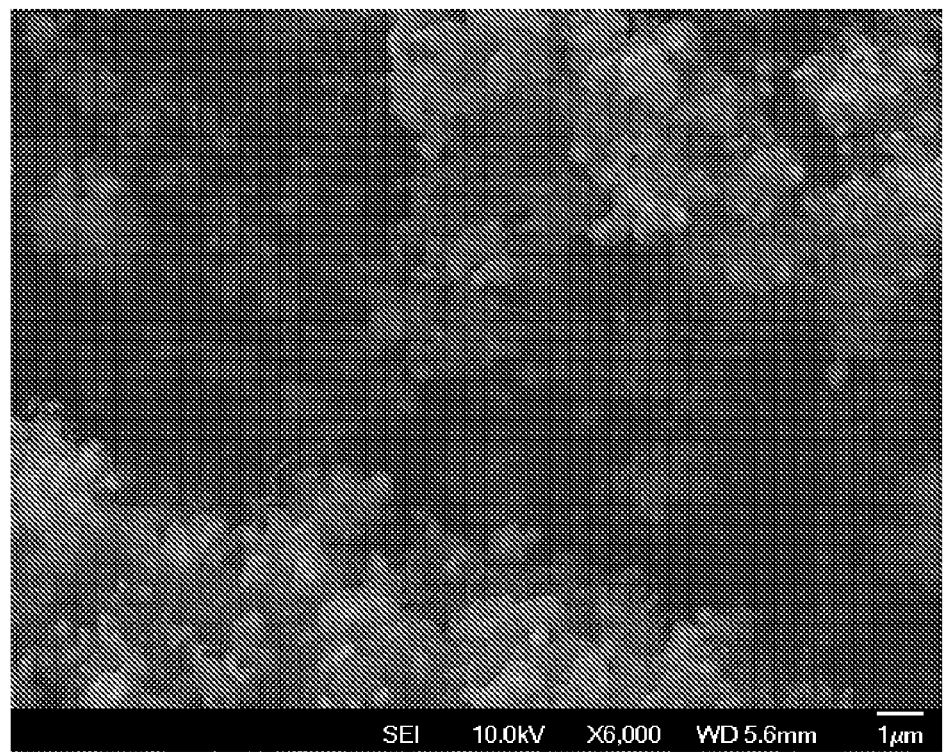
FIG. 14 displays an SEM image of long CNTs randomly oriented on Si wafer according to another embodiment of the present invention.
Figure 15:
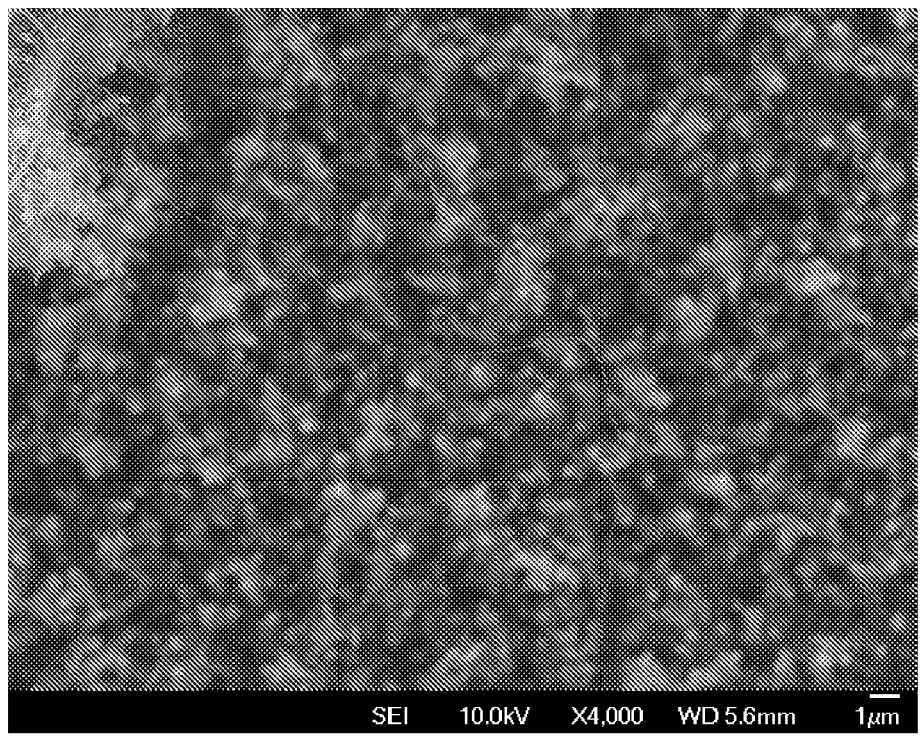
FIG. 15 displays an SEM image of long CNTs grown on Si wafer at 720° C. with acetylene according to another embodiment of the present invention.
Figure 16:
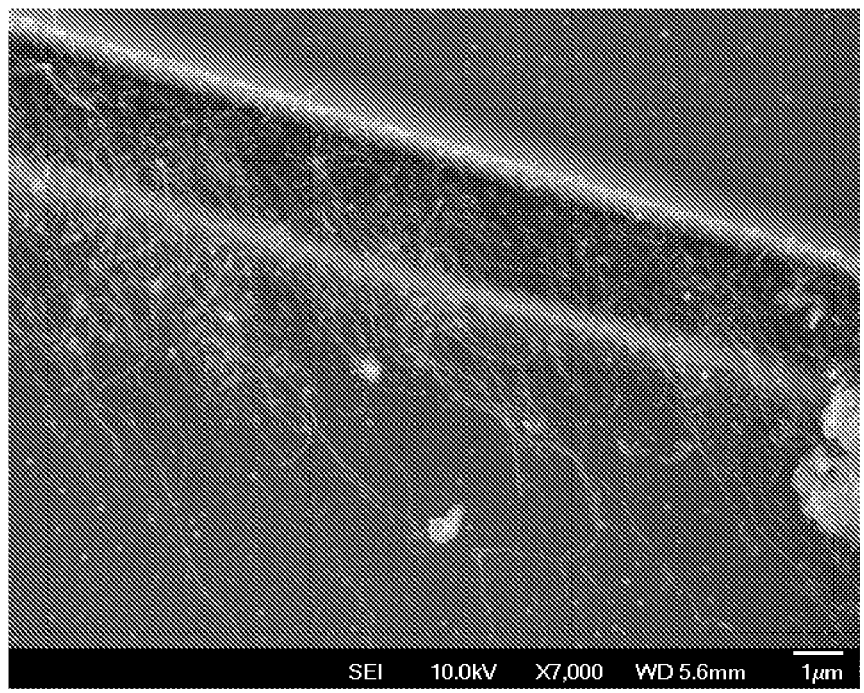
FIG. 16 displays an SEM image of high density long CNTs horizontally oriented on the Si wafer according to another embodiment of the present invention.
Figure 17:
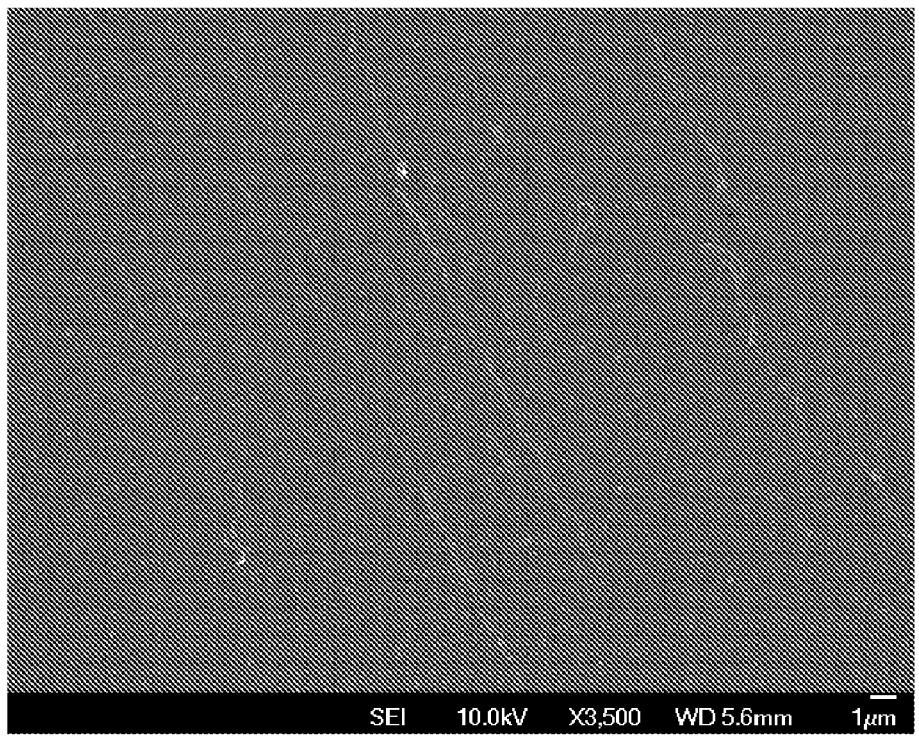
FIG. 17 displays an SEM image of horizontally aligned CNTs grown on Si wafer according to another embodiment of the present invention.

The Scanning Electron Microscope (SEM) was used analyze the distribution, length, density and morphology of CNTs grown on the Si wafer. Extremely long nanotubes (with lengths in hundreds of micro-meters) were grown on Si film by RF catalytic chemical vapor deposition. There is a high demand for horizontally aligned long CNTs in nano-electronics, especially for FETs. FIGS. 14 and 15 show SEM images of long CNTs, which are randomly oriented on the Si wafer, respectively. CNTs were grown at 720° C. utilizing acetylene as hydrocarbon source. FIG. 16 shows the SEM image of high density CNTs networks which are horizontally oriented on the Si wafer. In this case, most of the CNTs are grown on the edge of the wafer. Once the catalyst is deposited at the center of the Si wafer, it does not homogeneously distribute through the whole surface area. The same phenomenon was also observed from the AFM images. This is because the catalyst solution tends to accumulate on the edges of the wafer due to the surface tension and viscosity of the TEOS. FIG. 17 shows the SEM image of horizontally aligned CNTs. This is an image of the center of the Si wafer, whereas FIG. 16 shows a view of the wafer's edge. The CNTs grown at the center have a much lower density than the CNTs grown on the edge due to an inhomogeneous distribution of the catalyst. Even though, the CNTs grown at the center have a lower density, they are aligned much better (FIG. 17) than the nanotubes grown on the edges. This could be due to the homogeneous distribution of the catalyst at the center of the wafer. The distance between catalyst nano-particles plays a significant role in the horizontal alignment of CNTs. In addition, since only a small amount of the catalyst remains at the center of the Si wafer, low density CNT networks are observed.

Figure 18:
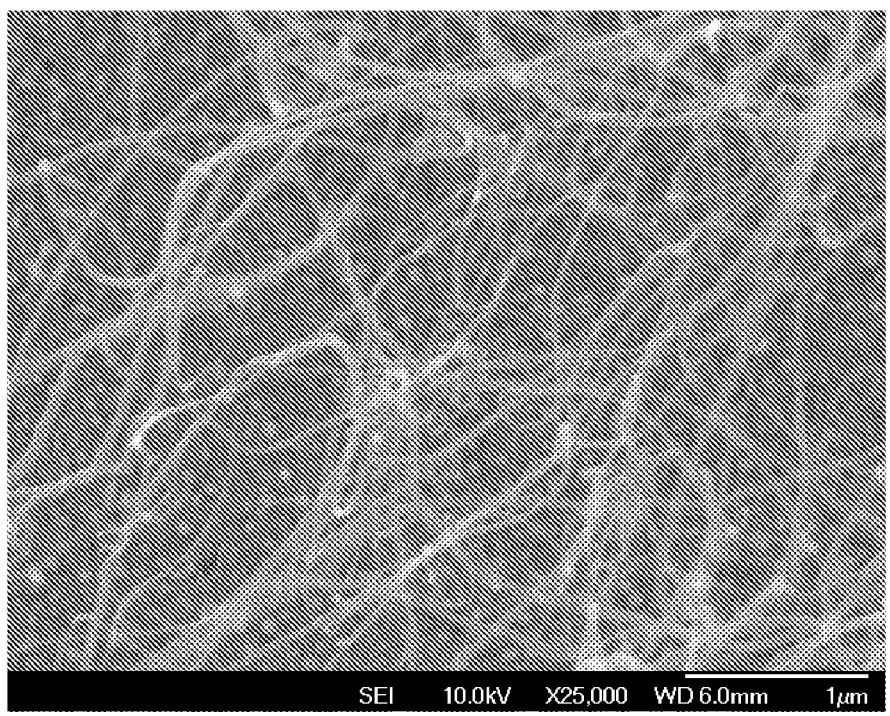
FIG. 18 displays an SEM image of high density long CNTs grown on Si wafer at 780° C. with acetylene according to another embodiment of the present invention.

FIG. 18 shows the SEM image of high density long CNTs grown on Si film at 780° C. with acetylene. At such temperature the CNTs are randomly oriented on the Si surface. Often the presence of such dense network makes it difficult to characterize CNTs with SEM. When CNTs are intercalated together it is challenging to estimate their length and determine where the nanotubes exactly start and end. The same challenge comes across while AFM measurements.

Figure 19:
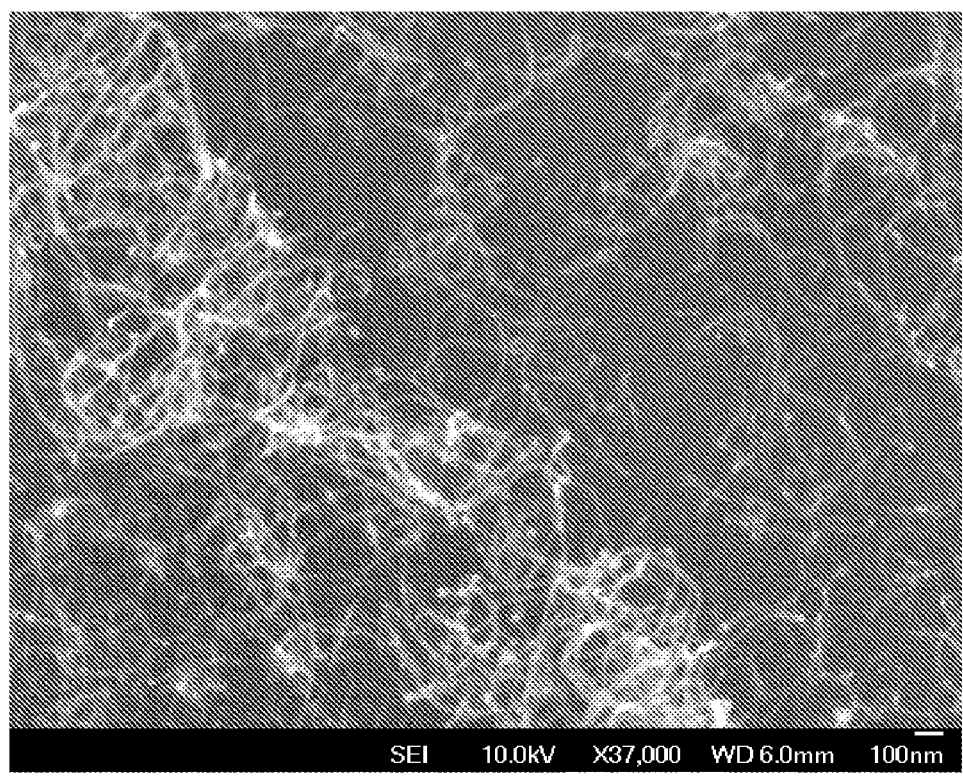
FIG. 19 displays an SEM image of high density CNTs networks grown on Si wafer with high catalyst concentration according to another embodiment of the present invention.

Next, the amount of the catalyst solution deposited onto the Si wafer was doubled and the corresponding SEM image is shown in FIG. 19. In this case the density of nanotubes appears to be much higher in some areas than in others. This confirms the inhomogeneous distribution of the catalyst, as its amount deposited on whole Si surface increases. It seems that when the amount of the catalyst solution is doubled, isolated CNTs as well as dense networks are grown all over the surface.

Figure 20:
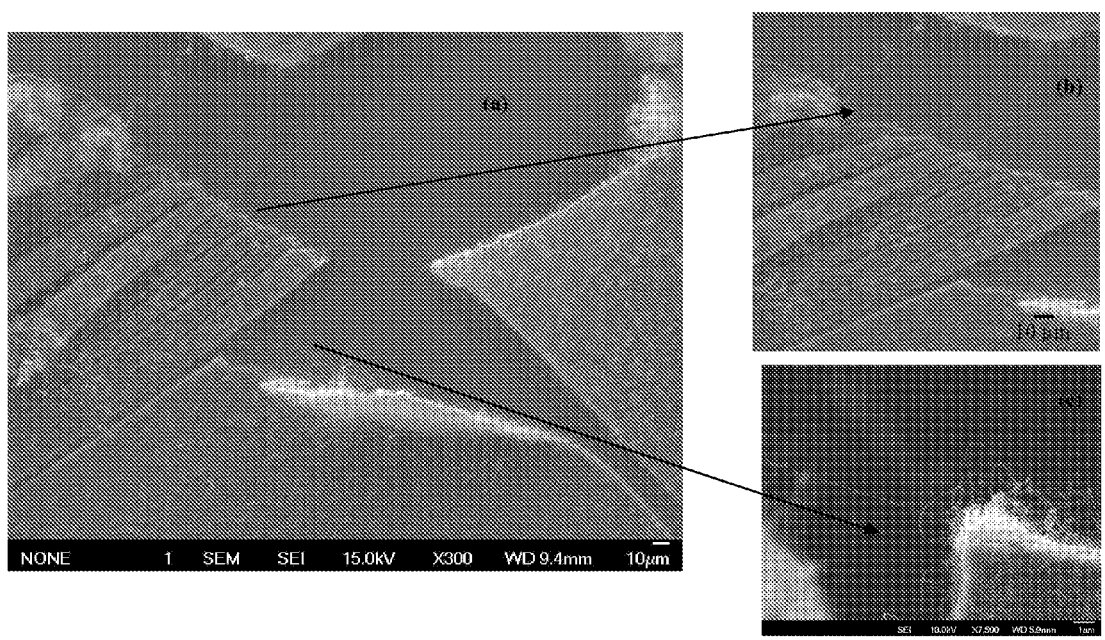
FIG. 20 displays SEM images of (a) Long CNTs grown on the Si wafer covered with TEOS and catalyst solution; (b) and (c) magnified areas showing CNTs aligning on the exposed part of the Si wafer according to another embodiment of the present invention, respectively.

Furthermore, it was noticed that CNTs tend to horizontally align themselves mostly on the exposed parts of the Si wafer. FIG. 20 shows the SEM images of nanotubes, which for the most part grow parallel to the substrate in the cracks of the deposited catalyst solution. At high temperatures, the layer of deposited solution brakes creating exposed parts on the wafer, which are ideal for CNT alignment. Similar results were observed others where different surfactants and tri-block co-polymer were used to make a catalyst sol-gel synthesis.

Example 5

This example describes Raman Spectroscopy analysis in connection with the CNTs grown according to one embodiment of the present invention.

Raman Spectroscopy has been widely used to analyze the crystallinity and the diameter distribution of CNTs. The vibrational modes observed in the Raman spectrum of CNTs are the Radial Breathing Mode (RBM), the D band, G band and the 2D band. The RBM peaks are usually observed between 100 to 400 cm$^{-1}$, and their position strongly depends on the diameter and chirality of the nanotubes. The RBM peaks are not likely to be observed in the Raman spectra of MWCNTs, due to the presence of large nanotube diameters and wide diameter distributions.

The D band is present between 1305 and 1330 cm$^{-1}$ and is related to the presence of defects and impurities in the carbon nanotubes. The G band or the tangential band, which is present between 1500 and 1605 cm$^{-1}$, it corresponds to the stretching mode of the carbon-carbon bond in the graphene plane. The last mode observed in the Raman spectrum of CNTs is the 2D band. This mode is a second-order harmonic of the D band, and is often present between 2450 and 2650 cm$^{-1}$. The 2D band is highly dispersive and is usually associated with the degree of crystallinity of the carbon nanotubes. The intensities of D, G and 2D bands have been measured to compare the quality of CNTs when grown in different conditions. Table 1 presents the positions and the relative intensity ratios of the D, G and 2D bands present in the Raman spectra of the CNTs that are discussed in this invention.

Figure 21:
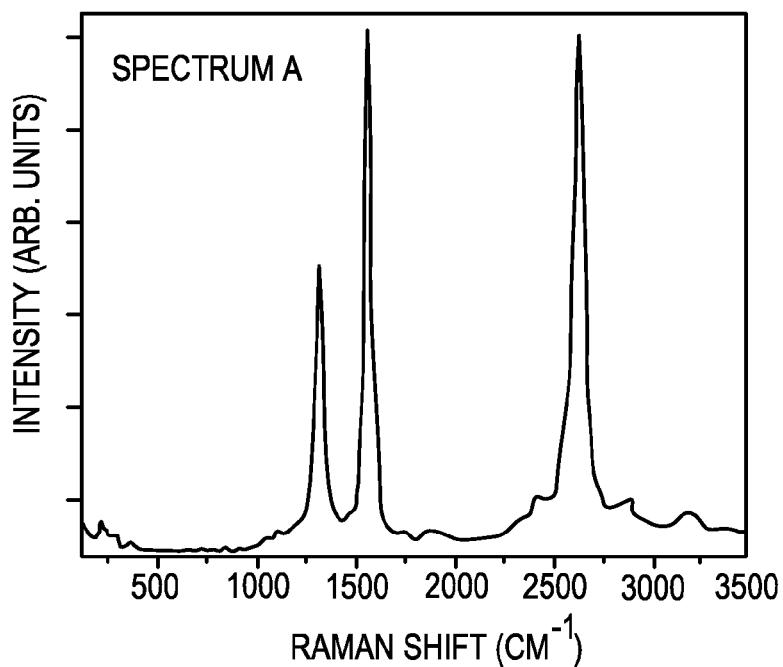
FIG. 21 shows Raman Spectrum of MWCNTs grown at 720° C. with acetylene.

The Raman scattering spectrum of the MWCNTs, grown on Si wafer at 720° C., is shown in FIG. 21. In this case the intensity of the "2D" band is relatively high and pretty close to the intensity of the "G" band. As shown in table 1, the intensity ratio between the G and 2D band ($I_G/I_{2D}$) is approximately one. Therefore, these MWCNTs have a very high crystallinity which reflects on the presence of very few defects and impurities. This is in good agreement with the SEM images, where the CNTs are very long and horizontally aligned on the Si wafer.

Figure 22:
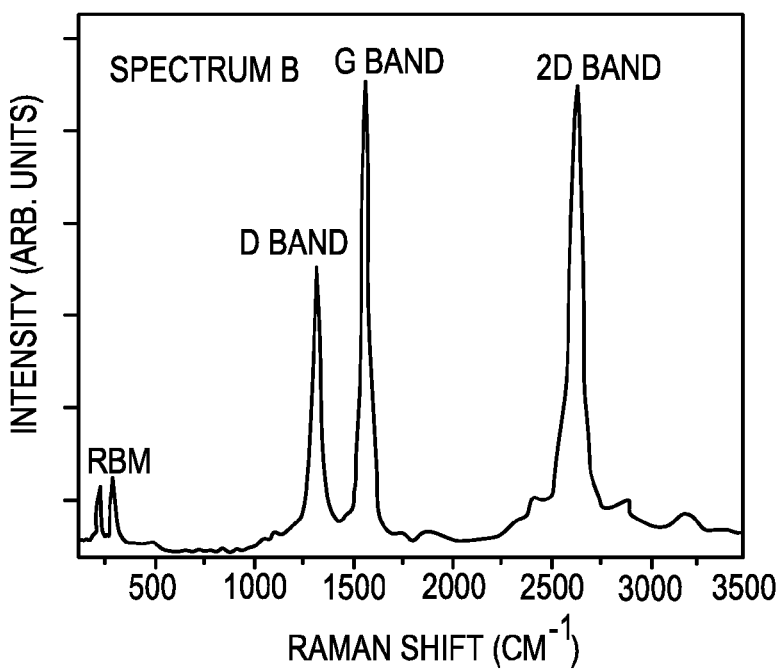
FIG. 22 shows Raman Spectrum of CNTs grown at 780° C. with acetylene.

FIG. 22 demonstrates the Raman spectrum of CNTs grown at 780° C. utilizing acetylene as a hydrocarbon source. In this case, a mixture of long SWCNTs and MWCNTs are grown on the Si wafer. This is confirmed by the presence of the RBM peaks positioned between 100 to 200 cm$^{-1}$, as shown in FIG. 22. Theoretical calculations of SWCNTs have shown that tube diameter d and the radial mode frequency $\omega_{RBM}$ exhibits the following striaghtforward relationship:

$$d(\text{nm}) = \frac{\alpha}{\omega_{RBM}\,(\text{cm}^{-1})} \quad (1)$$

where a=224 cm$^{-1}$·nm. The main RBM peaks and the corresponding diameters calculated using equation (1) are presented in Table 2. For spectrum "B" the corresponding diameters vary between 1 to 2 nm.

Furthermore, the Raman spectroscopic studies show that when temperature increases from 720 to 780° C. a mixture of SWCNTs as well as MWCNTs are grown on the Si wafer. In addition, SEM images reveal that at a higher temperature, high density networks of randomly oriented CNTs are grown on the wafer. This shows that when acetylene is utilized as a hydrocarbon source, temperature has an effect on the number of nanotube walls as well as CNT orientation. The peak positions of D, G and 2D bands, as shown in Table 1, do not vary significantly between spectrums "A" and "B" which represent CNTs grown at 720° C. and 780° C. respectively.

TABLE 1

The position and the relative intensity ratios of the D, G and 2D bands present in the Raman spectra for the carbon nanotubes that are discussed in this invention.

| Spectrum name | $\omega_D$ (cm$^{-1}$) | $\omega_G$ (cm$^{-1}$) | $\omega_{2D}$ (cm$^{-1}$) | $I_G/I_D$ | $I_G/I_{2D}$ |
|---|---|---|---|---|---|
| Spectrum A | 1325.36 | 1572.15 | 2646.96 | 1.74 | 1.02 |
| Spectrum B | 1325.36 | 1573.1 | 2648.86 | 1.29 | 1.18 |
| Spectrum C | 1319.7 | 1587.75 | 2604.16 | 3.09 | 2.69 |
| Spectrum D | 1326.31 | 1584.32 | 2654.23 | 1.5 | 1.82 |

TABLE 2

Spectral position and the corresponding diameter values of the Raman peaks collected with the 633 nm wavelength laser excitation.

| Spectrum name | $\omega_{RBM}$(cm$^{-1}$) | d (nm) |
|---|---|---|
| Spectrum B | 219.1; 179.27; 110.79; | 1.02; 1.25; 2.02; |
| Spectrum C | 102.98; 121.73; 131.88; 189.68; 214.59; 279.36; | 2.17; 1.84; 1.69; 1.18; 1.04; 0.8; |

TABLE 2-continued

Spectral position and the corresponding diameter values of the Raman peaks collected with the 633 nm wavelength laser excitation.

| Spectrum name | $\omega_{RBM}(cm^{-1})$ | d (nm) |
| --- | --- | --- |
| Spectrum D | 294.31;<br>103.98; 115.46; 121.91;<br>128.89; 174.71; 188.66;<br>206.59; | 0.76;<br>2.15; 1.94; 1.84;<br>1.73; 1.28; 1.18;<br>1.08; |

Figure 23:
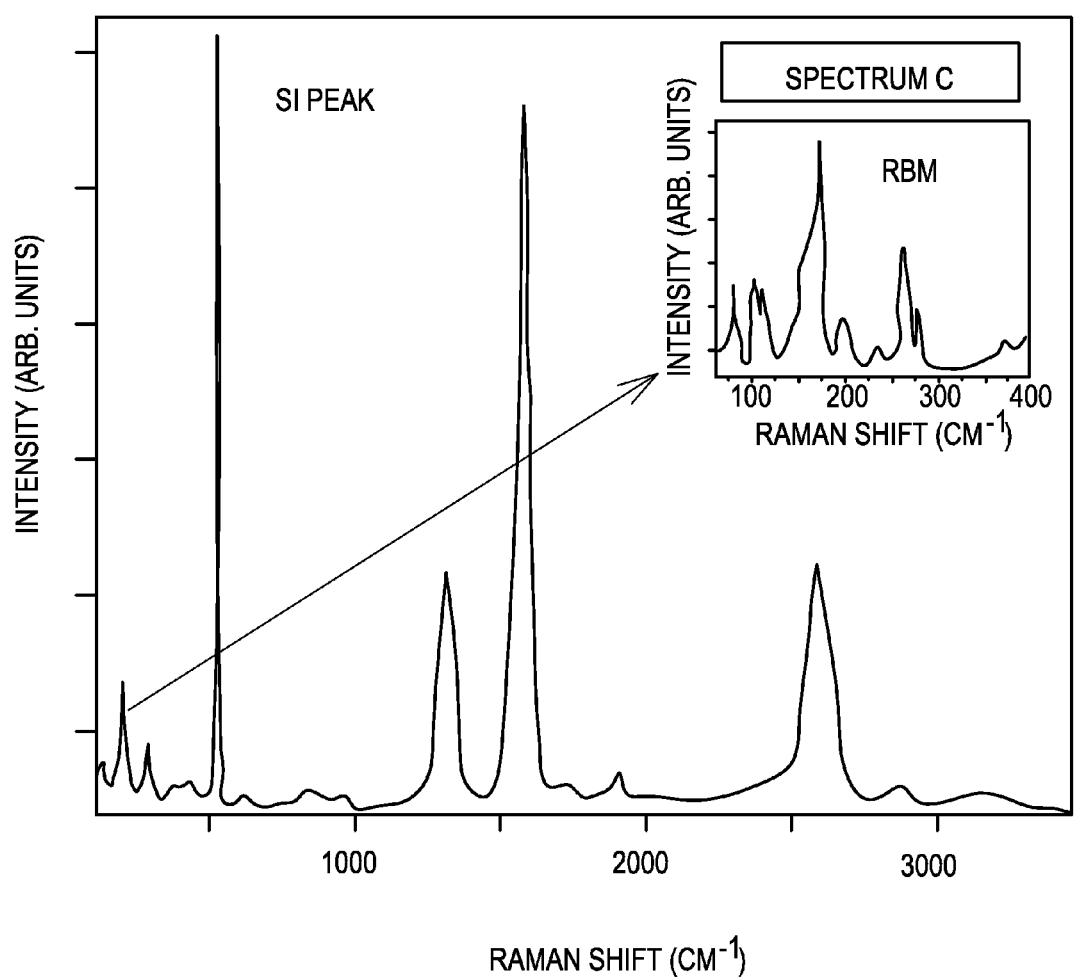
FIG. 23 shows Raman Spectrum of CNTs grown at 850° C. with methane.
Figure 25:
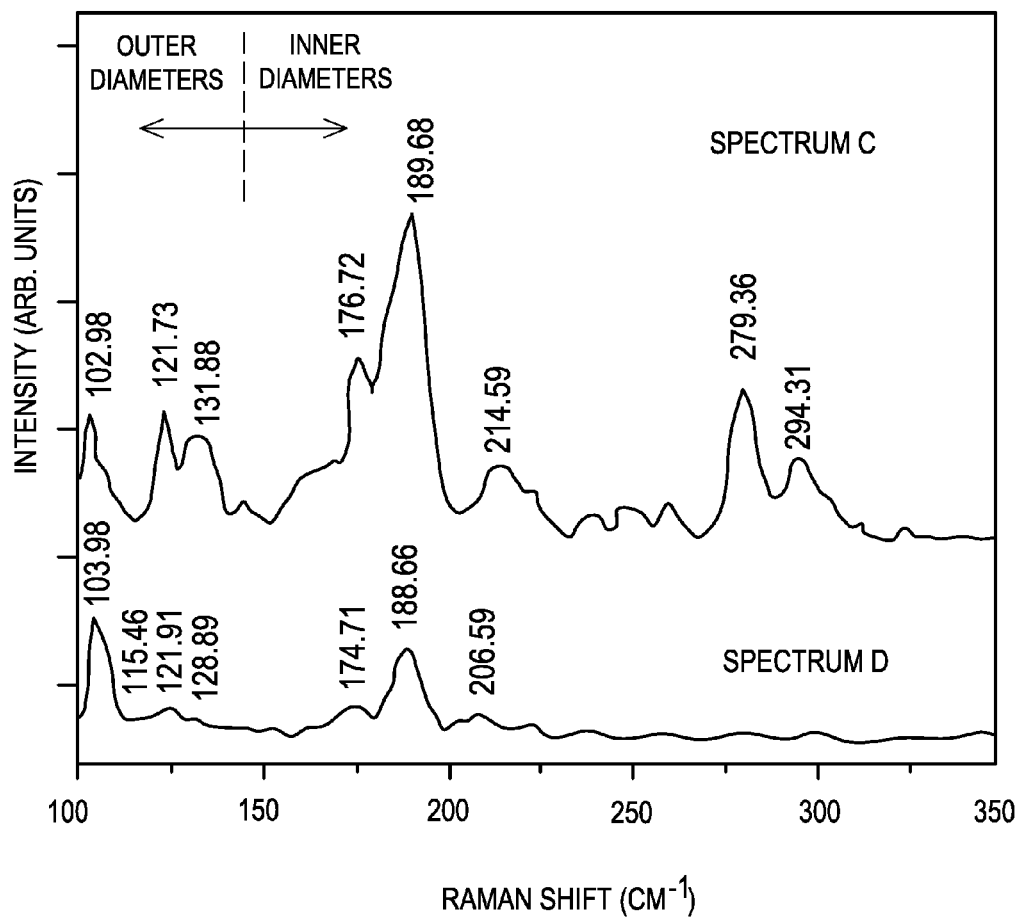
FIG. 25 shows the RBM regions of spectrum "C" and "D" corresponding to CNTs grown with low and high catalyst concentrations respectively.

FIG. 23 shows the Raman spectrum of CNTs grown with methane at 850° C. In this case, a conditioning catalyst (Mo/Al$_2$O$_3$) was used in addition to the Fe catalyst solution which was deposited on top of the wafer. As shown in table 1, the G/D intensity ratio is not very high due to an intense presence of the D band. This could be as a result of a few defects in the nanotubes, and the presence of MWCNTs and graphitic impurities. In addition, a mixture of SWCNTs and DWCNTs were grown, as shown in FIG. 25. Using equation 1, the frequencies of the RBM peaks are used to estimate the nanotube diameters. Every peak present in the RBM region of the spectrum "C" corresponds to a certain diameter of the SW or the DWCNTs bundles. As shown in table 2, the dominant outer diameters of DWCNTs vary between 1.7 to 1.84 nm, and the inner diameter distribution ranges from 1.04 to 1.18 nm.

Figure 24:
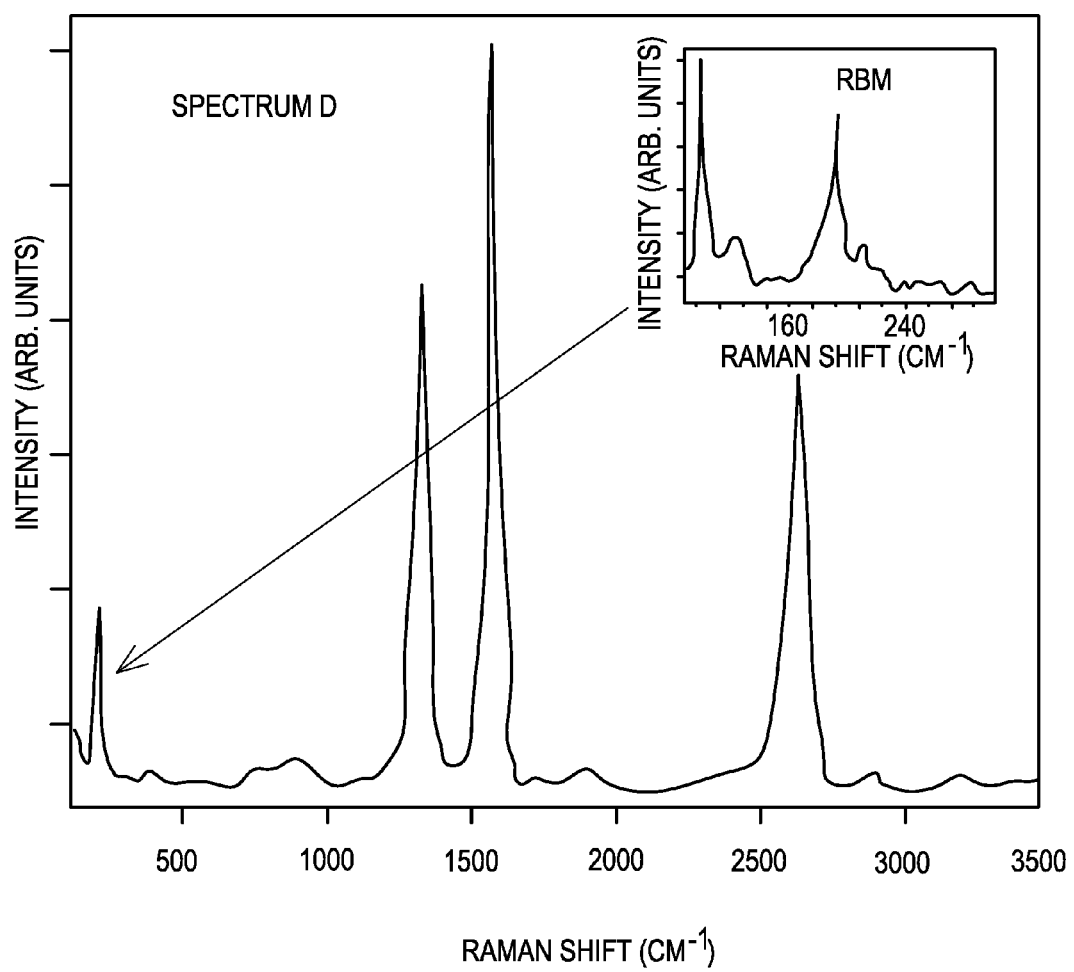
FIG. 24 shows Raman spectrum of CNTs grown on Si wafer with high catalyst concentration.

FIG. 24 shows the Raman spectrum of CNTs grown on Si wafer with high catalyst concentration. When the amount of Fe catalyst solution deposited on the Si wafer is doubled, DWCNTs with mainly inner diameters ranging from 1.08 to 1.28 nm are grown. Additionally, as shown in Table 2, the outer diameter distributions of these DWCNTs range from 1.74 to 1.94 m. In this case, the nanotubes have larger inner and outer diameters when compared to CNTs grown with lower catalyst concentration. Comparing the RBM regions of spectrum "C" and "D" in FIG. 25, it is observed that the RBM peaks corresponding to diameters smaller than 1 nm are absent in spectrum "C" of CNTs grown with higher catalyst concentration. It is believed that there is a direct correlation between the dimension of the CNT diameter and the size of the metal nano-particle. Usually, CNTs with small diameters are grown from small nano-particles. A higher amount of the catalyst solution could result into larger diameter particles. Therefore, the concentration of the catalyst solution deposited on the Si wafer has an effect on the size of nanotube diameters as also shown by others.

In general, a low ratio between the intensity of the G and D band ($I_G/I_D$) represents the presence of high carbonaceous products with structural defects. As shown in Table 1, the $I_D/I_G$ of the CNTs grown with low and high catalyst concentration, were found to be 3.09 and 1.5 respectively. As previously found by others, the ratio of G over D becomes lower as the concentration of the catalyst solution deposited on the Si wafer increases. Therefore, the Raman spectroscopy studies indicate that CNTs grown with high catalyst concentration have a lower crystallinity but larger diameters when compared to the nanotubes grown from lower catalyst amount.

Thus, in sum, among other things, the present invention in one aspect provides high quality long carbon nanotubes (with lengths in hundreds of micro-meters) that were efficiently grown on Si films by using a Radio-Frequency (RF) catalytic chemical vapor deposition method. Small amounts of Fe catalyst solutions were deposited on oxidized Si films, and two different types of hydrocarbon sources (methane/acetylene) were separately exploited to synthesize long and aligned nanotubes. The influence of hydrocarbon type and temperature on carbon nanotube (CNT) morphology and growth rate was systematically studied by using multiple techniques including Atomic Force Microscopy (AFM), SEM (Scanning Electron Microscopy) and Raman Spectroscopy. The amount of the catalyst solution deposited onto the Si wafer was varied and its affect on the CNT morphology and diameter distribution is also discussed. It was found that horizontally and randomly aligned CNTs were grown on Si films depending on the synthesis conditions. As the amount of the catalyst solution and reaction temperature increases, long and aligned isolated nanotubes as well as dense networks are grown all over the Si surface. The Raman spectroscopy studies indicate that CNTs grown with high catalyst concentration have lower crystallinity but larger diameters when compared to the nanotubes grown from a lower amount of catalyst.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. For example, multiple probes may be utilized at the same time to practice the present invention. Accordingly, the scope of the present invention is defined by the appended claims rather than the foregoing description and the exemplary embodiments described therein.

What is claimed is:

1. An apparatus for synthesizing nanostructures, comprising:
    (a) a chamber having a first end, an opposite, second end, and a body portion defined therebetween and defining a cavity with an axis;
    (b) a heating member formed on the exterior surface of the chamber for heating the chamber so as to create a reaction zone in the cavity;
    (c) a susceptor having a body portion defining a recess with a bottom surface therein, and placed in the reaction zone; and
    (d) a semiconductor plate having a film of a catalyst at least partially covering a first surface of the semiconductor plate, and placed in the recess and supported by the bottom surface of the susceptor such that a second surface of the semiconductor plate, which is opposite to the first surface of the semiconductor plate, is in contact with the bottom surface of the susceptor,
        wherein the semiconductor plate having a film of a catalyst and the susceptor are adapted such that when a gas having hydrocarbon passes through the cavity of the chamber, the interaction of the gas having hydrocarbon with the film of a catalyst produces carbon nanostructures.

2. The apparatus of claim 1, wherein the chamber further comprises a first opening channel interconnecting through the first end in fluid communication with the cavity, and a second opening channel interconnecting through the second end in fluid communication with the cavity.

3. The apparatus of claim 1, wherein the first opening channel is adapted for a gas to enter, and the second opening channel is adapted for an exhaust gas to exit, respectively.

4. The apparatus of claim 1, wherein the heating member comprises a thermal oven, an inductive oven, or a combination thereof.

5. The apparatus of claim 1, wherein the semiconductor plate is made of Si.

6. The apparatus of claim 5, wherein the catalyst comprises a Fe catalyst, a conditioning catalyst, or a combination thereof.

7. The apparatus of claim 1, wherein the susceptor is made from graphite, ceramic, metal, or a combination thereof.

8. The apparatus of claim 1, wherein the gas having hydrocarbon comprises acetylene, methane, or a combination thereof.

9. The apparatus of claim 1, wherein the carbon nanostructures comprise nanotubes.

10. A method for synthesizing nanostructures, comprising the steps of:
    (a) providing an apparatus, wherein the apparatus comprises:
        a chamber having a first end, an opposite, second end, and a body portion defined therebetween and defining a cavity with an axis;
        a heating member formed on the exterior surface of the chamber for heating the chamber so as to create a reaction zone in the cavity;
        a susceptor having a body portion defining a recess with a bottom surface therein, and placed in the reaction zone; and
        a semiconductor plate having a film of a catalyst at least partially covering a first surface of the semiconductor plate, and placed in the recess and supported by the bottom surface of the susceptor such that a second surface of the semiconductor plate, which is opposite to the first surface of the semiconductor plate, is in contact with the bottom surface of the susceptor;
    (b) introducing a gas mixture through the first opening channel into the cavity of the chamber; and
    (c) generating nanostructures from the interaction of the gas mixture with the film of a catalyst in the reaction zone.

11. The method of claim 10, wherein the gas mixture comprises at least one of a carrier gas and a feedstock gas.

12. The method of claim 11, wherein the feedstock gas comprises hydrocarbon.

13. The method of claim 12, wherein the feedstock gas having hydrocarbon comprises acetylene, methane, or a combination thereof.

14. The method of claim 10, further comprising the steps of:
    (a) turning on the heating member so that the temperature of the susceptor reaches a first temperature;
    (b) increasing the temperature of the susceptor from the first temperature to a second temperature when the gas mixture is introduced into the cavity of the chamber; and
    (c) keeping the temperature of the susceptor substantially at the second temperature when nanostructures are generated.

15. The method of claim 14, wherein the first temperature is below about 700° C., and the first temperature is above about 700° C.

16. The method of claim 10, wherein the carbon nanostructures comprise nanotubes.

17. An apparatus for synthesizing nanostructures, comprising:
    (a) a chamber having a first end, an opposite second end, and a body portion defined therebetween;
    (b) a heating member formed on the exterior surface of the body portion of the chamber defining a reaction zone inside the chamber;
    (c) a conductive susceptor positioned in the reaction zone; and
    (d) a semiconductor plate having a film of a catalyst, and supported by the conductive susceptor,
        wherein the heating member comprises a conductive inductor in the form of inductor coils; and
        wherein the conductive inductor is configured such that, in operation, when a gas having hydrocarbon passes through the cavity of the chamber, the conductive inductor allows an alternating current to pass through to generate an electromagnetic field with a frequency at least in the reaction zone and induce current in the conductive susceptor so as to generate a heat flow from the conductive susceptor to the body portion of the chamber to allow nanostructures to be grown from the interaction of the gas having hydrocarbon with the film of a catalyst of the semiconductor plate.

18. The apparatus of claim 17, wherein the conductive susceptor is made of a substantially conductive material.

19. The apparatus of claim 18, wherein the conductive susceptor is made of a substantially conductive material that is chemically compatible to carbon and its compounds.

20. The apparatus of claim 19, wherein the substantially conductive material that is chemically compatible to carbon and its compounds comprises graphite.

21. The apparatus of claim 20, wherein the semiconductor plate is made of Si.

22. A method for synthesizing nanostructures in a reactor having a reaction zone and a conductive susceptor positioned in the reaction zone, comprising the steps of:
    (a) placing a semiconductor plate having a film of a catalyst in the reaction zone such that the semiconductor plate is supported by the conductive susceptor;
    (b) transporting a gas mixture having a feedstock gas having hydrocarbon and a carrier gas into the reaction zone of the chamber;
    (b) inductively heating the reaction zone; and
    (c) regulating the heating so that the temperature of the conductive susceptor increases from a first temperature to a second temperature when the gas mixture is introduced into the cavity of the chamber to allow nanostructures to be grown from the interaction of the gas mixture with the film of a catalyst of the semiconductor plate.

23. The method of claim 22, wherein the inductively heating step comprises the step of inducing current in the conductive susceptor so as to generate a heat flow from the conductive susceptor.

24. The method of claim 22, wherein the feedstock gas having hydrocarbon comprises acetylene, methane, or a combination thereof.

25. The method of claim 22, wherein the first temperature is below about 700° C., and the first temperature is above about 700° C.

26. The method of claim 22, wherein the semiconductor plate is made of Si.

* * * * *